(12) United States Patent
Xi et al.

(10) Patent No.: US 11,901,324 B2
(45) Date of Patent: Feb. 13, 2024

(54) CHIP PACKAGE METHOD AND CHIP PACKAGE STRUCTURE

(71) Applicant: Shanghai AVIC OPTO Electronics Co., Ltd., Shanghai (CN)

(72) Inventors: Kerui Xi, Shanghai (CN); Feng Qin, Shanghai (CN); Jine Liu, Shanghai (CN); Xiaohe Li, Shanghai (CN); Tingting Cui, Shanghai (CN)

(73) Assignee: Shanghai AVIC OPTO Electronics Co., Ltd., Shanghai (CN)

( * ) Notice: Subject to any disclaimer, the term of this patent is extended or adjusted under 35 U.S.C. 154(b) by 71 days.

(21) Appl. No.: 17/451,621

(22) Filed: Oct. 20, 2021

(65) Prior Publication Data

US 2022/0084973 A1      Mar. 17, 2022

Related U.S. Application Data

(63) Continuation-in-part of application No. 16/456,392, filed on Jun. 28, 2019, now Pat. No. 11,183,463.

(30) Foreign Application Priority Data

Mar. 29, 2019   (CN) .......................... 201910250625.6

(51) Int. Cl.
   *H01L 23/00*     (2006.01)
   *H01L 23/31*     (2006.01)
(52) U.S. Cl.
   CPC .......... *H01L 24/20* (2013.01); *H01L 23/3135* (2013.01); *H01L 24/13* (2013.01);
   (Continued)

(58) Field of Classification Search
   CPC . H01L 23/544; H01L 21/02118; H01L 21/56; H01L 21/6835; H01L 23/3157;
   (Continued)

(56) References Cited

U.S. PATENT DOCUMENTS

2017/0323868 A1\*   11/2017   Park .................... H01L 23/3185
2018/0286793 A1    10/2018   Cheng et al.
   (Continued)

FOREIGN PATENT DOCUMENTS

CN          100435334 C      11/2008
CN          104465412 A       3/2015
   (Continued)

*Primary Examiner* — Mohammed R Alam
(74) *Attorney, Agent, or Firm* — Anova Law Group, PLLC

(57) ABSTRACT

Chip package structure is provided. The chip package structure includes: a chip, the chip including metal pins; an organic polymer material layer, the organic polymer material layer being located on a side of the metal pins away from the chip, the organic polymer material layer including a first via hole, and the organic polymer material layer including a first surface away from the chip; metal parts, at least a portion of the metal parts being located in the first via hole, the metal parts and metal pins being electrically connected, the metal parts including a second surface away from the chip, and the second surface and the first surface being flush to each other; and an encapsulating layer, the encapsulating layer being located on a side of the metal parts away from the organic polymer material layer.

12 Claims, 28 Drawing Sheets

(52) U.S. Cl.
CPC .............. *H01L 24/19* (2013.01); *H01L 24/96* (2013.01); *H01L 24/97* (2013.01); *H01L 2224/13023* (2013.01); *H01L 2224/2101* (2013.01)

(58) Field of Classification Search
CPC ......... H01L 23/481; H01L 2223/54426; H01L 23/3128; H01L 2221/68381; H01L 2221/68372; H01L 2221/68345; H01L 21/568; H01L 24/18; H01L 2224/18; H01L 21/50; H01L 23/3107; H01L 25/16; H01L 23/293
See application file for complete search history.

(56) References Cited

U.S. PATENT DOCUMENTS

2019/0385989 A1    12/2019   Yu et al.
2020/0098693 A1     3/2020   Jeng et al.

FOREIGN PATENT DOCUMENTS

| CN | 107068669 A | 8/2017 |
| CN | 107204333 A | 9/2017 |
| CN | 107680912 A | 2/2018 |

\* cited by examiner in its
entirety.

CHIP PACKAGE METHOD AND CHIP PACKAGE STRUCTURE

CROSS-REFERENCES TO RELATED APPLICATION

This application is a continuation-in-part application of U.S. patent application Ser. No. 16/456,392, filed on Jun. 28, 2019, which claims the priority of Chinese Patent Application No. 201910250625.6, filed on Mar. 29, 2019, the content of which is incorporated herein by reference in its entirety.

TECHNICAL FIELD

The present disclosure generally relates to the field of display technology and, more particularly, relates to a chip package method and a chip package structure.

BACKGROUND

Chip package usually refers to a technology of packaging integrated circuits with insulating plastic or ceramic materials. It can also refer to an outer case for mounting semiconductor integrated circuits. The chip package not only plays roles for mounting, fixing, sealing, protecting, and improving thermal conductivity of integrated circuit chips, but also provides a bridge for electrical connecting the integrated circuit chips to external circuits. Contact points of the integrated circuit chips are electrically connected to pins of the chip package case, and the pins of the chip package case are electrically connected to other devices through wires on printed circuit boards. For many integrated circuit products, a chip package technology is a very critical part.

As an integration level and volume miniaturization of integrated circuits continuously develop, a Fan-Out Wafer Level Packaging (FOWLP) technology is provided. However, the FOWLP technology has low efficiency and a high cost.

SUMMARY

One aspect of the present disclosure provides a chip package method. The method includes: providing a transparent substrate including a first side and a second side opposite to the first side; coating the first side of the transparent substrate with an organic polymer material layer; depositing a protective layer on the organic polymer material layer; forming a plurality of alignment parts on a side of the protective layer away from the organic polymer material layer; attaching a plurality of chips including a plurality of metal pins on the protective layer; forming an encapsulating layer at the side of the protective layer away from the organic polymer material layer; polishing the encapsulating layer to expose the plurality of metal pins; forming a first insulating layer; forming a plurality of first through holes in the first insulating layer; forming a plurality of metal parts extending along sidewalls of the plurality of first through holes; and irradiating the second side of the transparent substrate by a laser to lift off the transparent substrate. The plurality of metal parts is insulated from each other and is electrically connected to the plurality of metal pins.

Another aspect of the present disclosure provides a chip package structure. The structure includes: an organic polymer material layer; a protective layer covering the organic polymer material layer; a plurality of alignment parts on a side of the protective layer away from the organic polymer material layer; a plurality of chips; an encapsulating layer on the one side of the protective layer away from the organic polymer material layer; and a plurality of metal parts on a side of the encapsulating layer away from the organic polymer material layer. The plurality of chips and the plurality of alignment parts are disposed on a same side of the protective layer, and the plurality of chips includes a plurality of metal pins at a side of the plurality of chips away from the organic polymer material layer. The plurality of metal parts is electrically connected to the plurality of metal pins.

Another aspect of the present disclosure provides another chip package method. The method includes: providing a transparent substrate including a first side and a second side opposite to the first side; coating the first side of the transparent substrate with an organic polymer material layer; depositing a protective layer on the organic polymer material layer; forming a plurality of metal parts; forming a first insulating layer on a side of the protective layer away from the transparent substrate and forming a plurality of first through holes in the first insulating layer; forming a plurality of alignment parts on the first insulating layer; soldering a plurality of chips including a plurality of metal pins on the first insulating layer; forming an encapsulating layer at the side of the first insulating layer away from the organic polymer material layer; and irradiating the second side of the transparent substrate by a laser to lift off the transparent substrate. The plurality of metal parts is insulated from each other and also is insulated from the plurality of alignment parts. Along a direction perpendicular to the organic polymer material layer, each of the plurality of metal pins at least partially overlaps a corresponding one of the plurality of first through holes. Each of the plurality of metal parts extends along sidewalls of a corresponding one of the plurality of first through holes and is electrically connected to a corresponding one of the plurality of metal pins.

Another aspect of the present disclosure provides another chip package structure. The structure includes: an organic polymer material layer; a protective layer covering the organic polymer material layer; a plurality of metal parts on a side of the protective layer away from the organic polymer material layer; a plurality of alignment parts; a plurality of chips on a side of the plurality of metal parts; and an encapsulating layer on the one side of the plurality of metal parts away from the organic polymer material layer. The plurality of metal parts and the plurality of alignment parts are disposed on a same side of the organic polymer material layer. The plurality of chips is disposed on a side of the plurality of metal parts away from the organic polymer material layer and includes a plurality of metal pins at a side of the plurality of chips close to the organic polymer material layer. The plurality of metal pins is electrically connected to the plurality of metal parts.

Another aspect of the present disclosure provides another chip package structure. The structure includes: a chip, the chip including metal pins; an organic polymer material layer, the organic polymer material layer being located on a side of the metal pins away from the chip, the organic polymer material layer including a first via hole, and the organic polymer material layer including a first surface away from the chip; metal parts, at least a portion of the metal parts being located in the first via hole, the metal parts and metal pins being electrically connected, the metal parts including a second surface away from the chip, and the second surface and the first surface being flush to each other; and an encapsulating layer, the encapsulating layer being located on a side of the metal parts away from the organic polymer material layer.

Another aspect of the present disclosure provides another chip package structure. The structure includes: a chip, the chip including metal pins; an organic polymer material layer, the organic polymer material layer being located on a side of the metal pins away from the chip, the organic polymer material layer including a first via hole, and the organic polymer material layer including a first surface close to the chip; metal parts, the metal parts and metal pins being electrically connected, the metal parts including a second surface away from the chip, and the second surface and the first surface being flush to each other; and an encapsulating layer, the encapsulating layer being located on a side of the metal parts away from the organic polymer material layer.

Another aspect of the present disclosure provides another chip package structure. The structure includes: an organic polymer material layer; a protective layer, wherein the protective layer covers and in contact with the organic polymer material layer; metal parts, located on a side of the protective layer away from the organic polymer material layer; a chip, located on a side of the metal parts away from the organic polymer material layer and including metal pins, wherein the metal pins are located on a side of the chip close to the organic polymer material layer and electrically connected to the metal parts; and an encapsulating layer, located on the side of the metal parts away from the organic polymer material.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
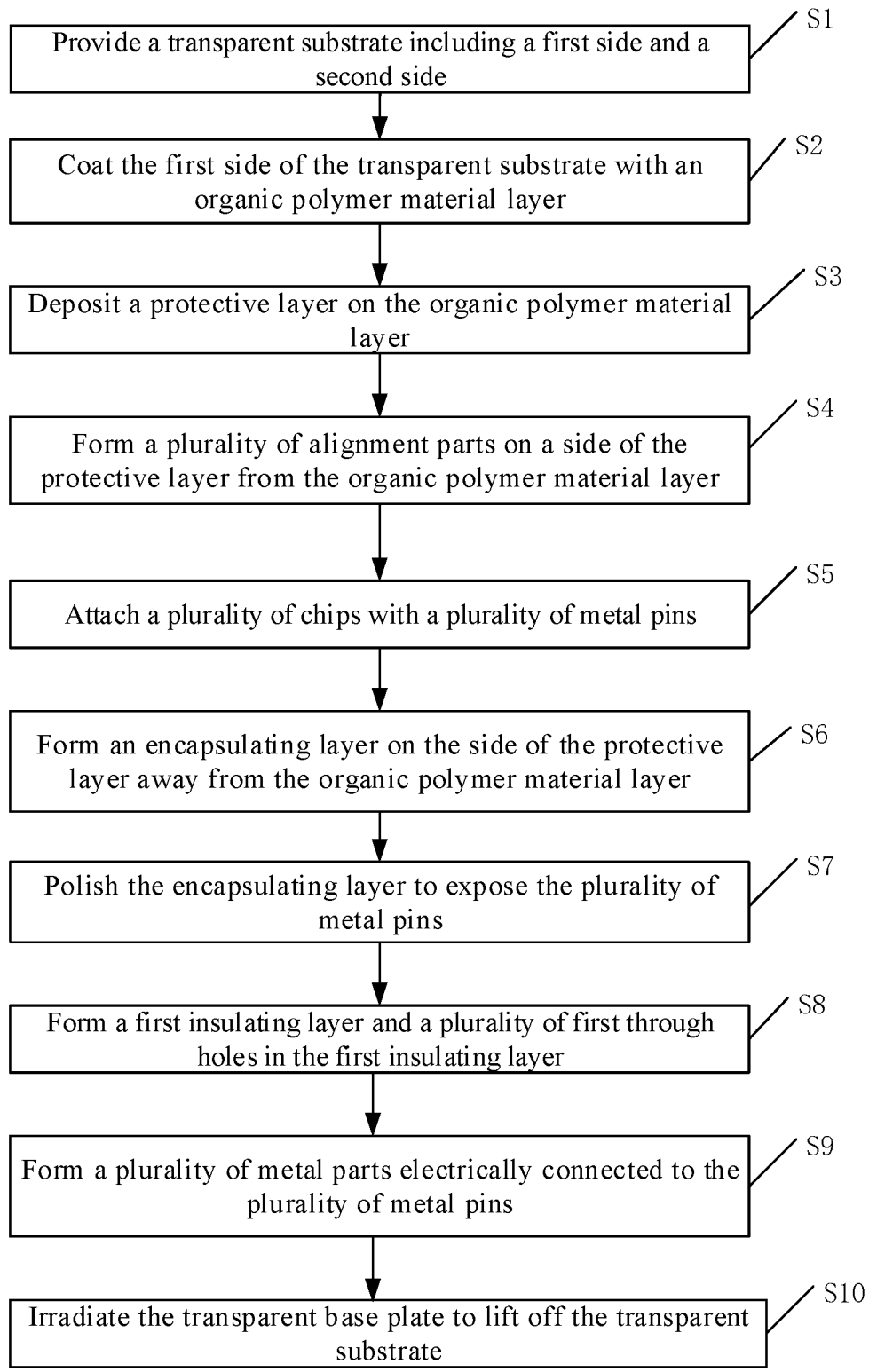
FIG. 1 illustrates an exemplary chip package method consistent with various disclosed embodiments in the present disclosure.
Figure 2:
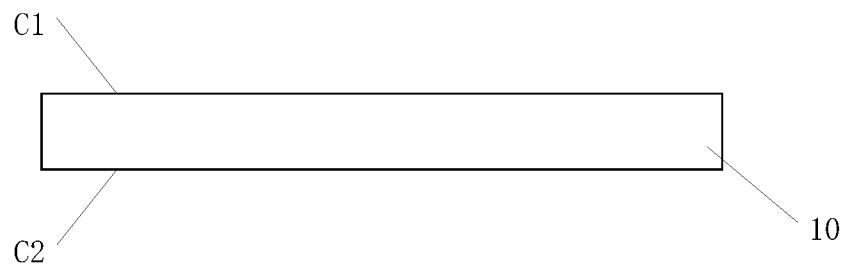
FIGS. 2-11 illustrate cross-section views of an exemplary chip package structure corresponding to different steps in the chip package method in FIG. 1 consistent with various disclosed embodiments in the present disclosure.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the disclosure. Furthermore, a three-dimensional (3D) size including length, width and depth should be considered during practical fabrication.

FIG. 1 illustrates an exemplary chip package method consistent with various disclosed embodiments in the present disclosure. FIGS. 2-11 illustrate cross-section views of an exemplary chip package structure corresponding to different steps in the chip package method in FIG. 1 consistent with various disclosed embodiments in the present disclosure. As illustrated in FIGS. 1-11, in one embodiment, the chip package method may include:

Step S1: providing a transparent substrate 10 including a first side C1 and a second side C2 opposite to the first side C1;

Step S2: coating the first side C1 of the transparent substrate 10 with an organic polymer material layer 11;

Step S3: depositing a protective layer 12 on the organic polymer material layer 11;

Step S4: forming a plurality of alignment parts 132 on the protective layer 12;

Step S5: attaching a plurality of chips 14 including a plurality of metal pins 141 to the protective layer 12;

Step S6: forming an encapsulating layer 15 at a side of the protective layer 12 away from the organic polymer material layer 11;

Step S7: polishing the encapsulating layer 15 to expose the plurality of metal pins 141;

Step S8: forming a first insulating layer 16 and forming a plurality of first through holes K1 in the first insulating layer;

Step S9: forming a plurality of metal parts 17; and

Step S10: irradiating the second side C2 of the transparent substrate 10 with a laser to lift off the transparent substrate 10.

Figure 3:
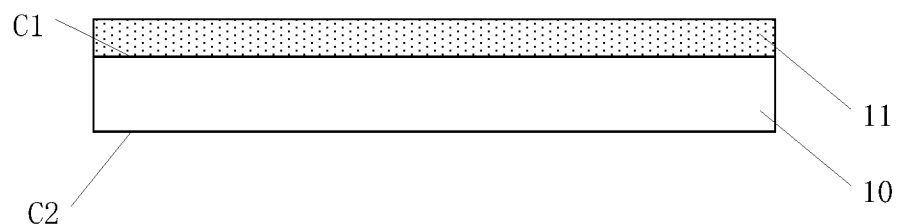

In Step S2, as illustrated in FIG. 1 and FIG. 3, the first side C1 of the transparent substrate 10 may be coated with the organic polymer material layer 11. In one embodiment, the organic polymer material layer 11 may be made of polyimide.

Figure 4:
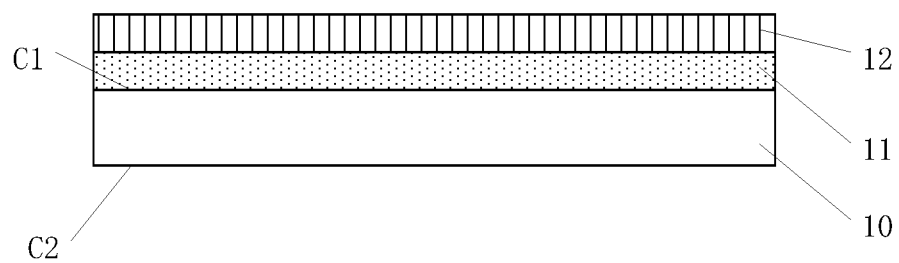

In Step S3, as illustrated in FIG. 1 and FIG. 4, the protective layer 12 may be deposited on the organic polymer material layer 11. In one embodiment, the protective layer 12 may be formed by a coating method. Correspondingly, the whole packaging structure may have a high flatness. In one embodiment, the protective layer 12 and the organic polymer material layer 11 may be made of transparent materials.

Figure 5:
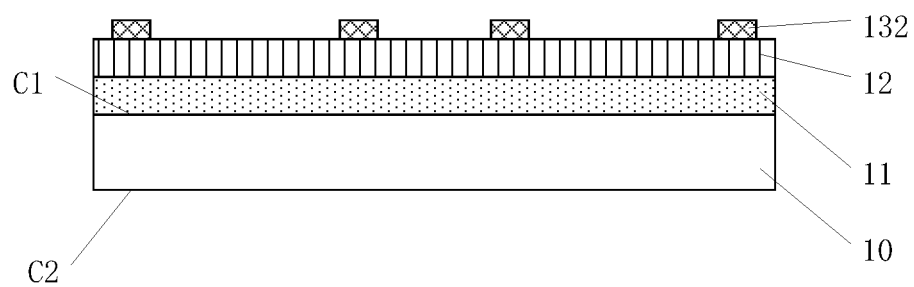
Figure 6:
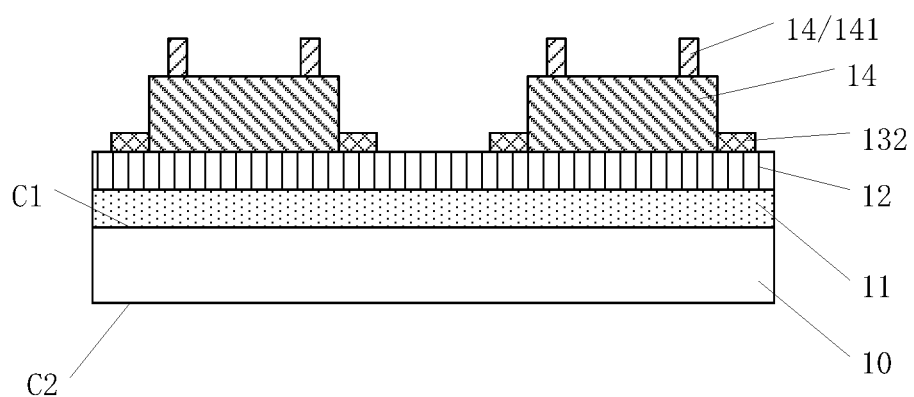

In Step S4, as illustrated in FIG. 1 and FIGS. 5-6, the plurality of alignment parts 132 may be formed on the one side of the protective layer 12 away from the organic polymer material layer 11 and the transparent substrate 10, to improve alignment accuracy of subsequent processes.

Figure 7:
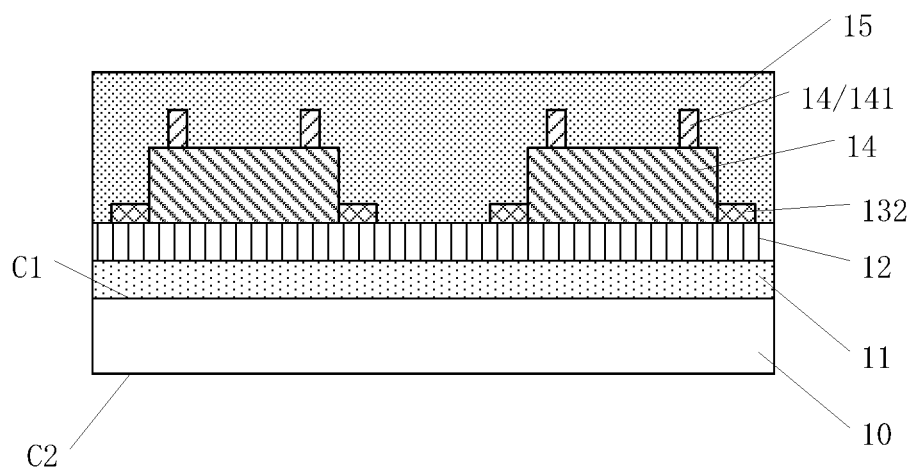

In Step S6, as illustrated in FIG. 1 and FIG. 7, the encapsulating layer 15 may be formed at the one side of the protective layer 12 away from the transparent substrate 10. The encapsulating layer 15 may prevent external matters (such as water and oxygen) from entering the plurality of chips 14, and avoid an influence of the external matters (such as water and oxygen) on a performance of the plurality of chips 14.

Figure 8:
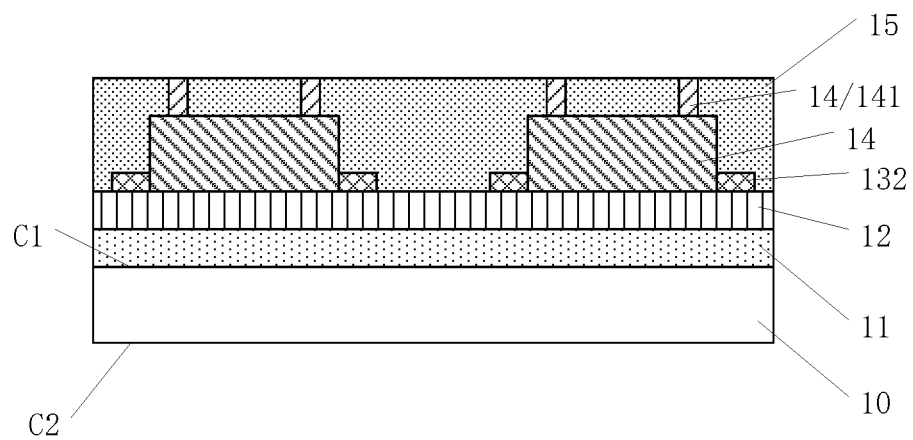

After forming the encapsulating layer 15, the plurality of chips 14 may be sealed completely by the encapsulating layer 15 and the plurality of metal pins 141 cannot be connected to external circuits. In Step S7, as illustrated in FIG. 1 and FIG. 8, the encapsulating layer 15 may be polished to expose the plurality of metal pins 141. Correspondingly, the plurality of metal pins 141 can be connected to external circuits.

Figure 9:
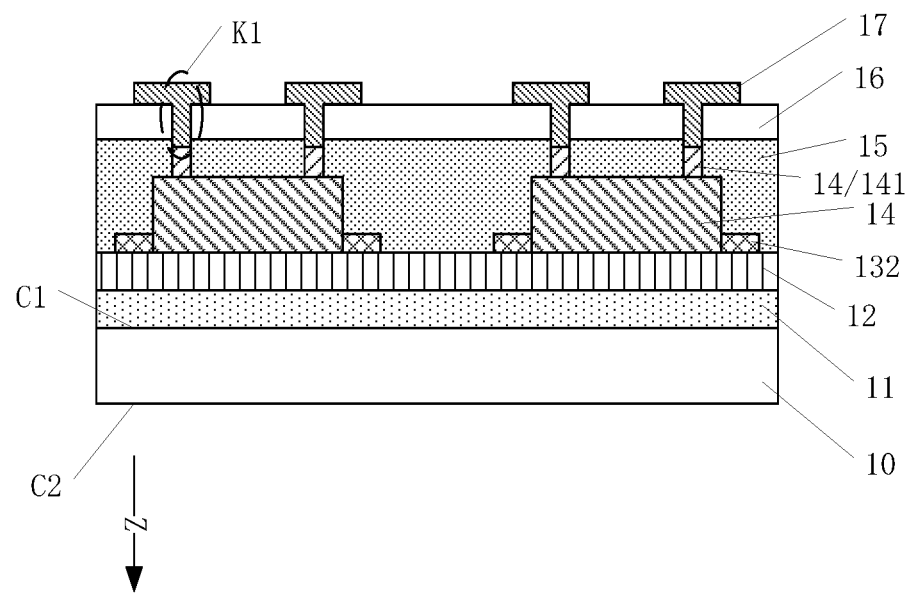

In Step S8 and Step S9 illustrated in FIG. 1 and FIG. 9, a side of the encapsulating layer 15 away from the transparent substrate 10 may be coated with the first insulating layer 16. The first insulating layer 16 may prevent short circuits between the plurality of metal parts 17 and other film layers. The first insulating layer 16 may also function as a buffer layer, and may make the flatness of the entire chip package structure more uniform. The plurality of first through holes K1 may be formed in the first insulating layer 16. Along a direction Z perpendicular to the organic polymer material layer 11, each of the plurality of first through holes K1 may at least partially overlap one of the plurality of metal pins 141. The plurality of metal parts 17 may extend along sidewalls of the plurality of first through holes K1, and may be insulated from each other. The plurality of metal parts 17 may be electrically connected to the plurality of metal pins 141 through the plurality of first through holes K1. Correspondingly, electric signals from the plurality of chips 14 may be transmitted out from the plurality of metal pins 141.

Figure 10:
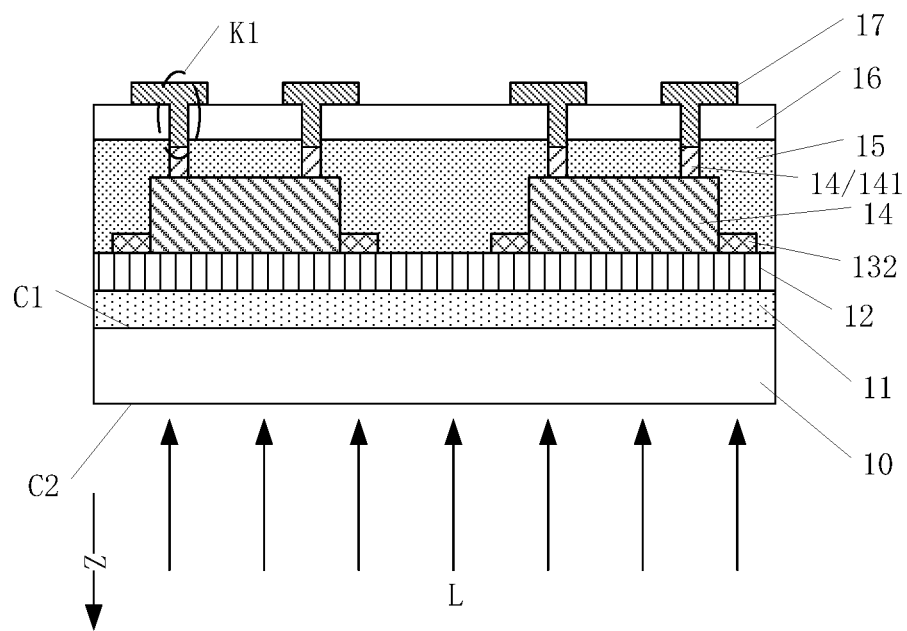
Figure 11:
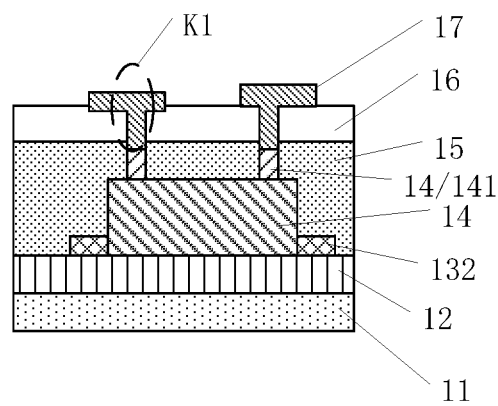

In Step S10 illustrated in FIG. 1 and FIGS. 10-11, the second side C2 of the transparent substrate 10 may be irradiated with a laser to lift off the transparent substrate 10. In one embodiment, after lifting off the transparent substrate 10, the entire chip package structure may be cut by a laser cutting method, to separate the plurality of chips 14 packaged simultaneously to a plurality of independently packaged chips.

In the chip package method provided by various embodiments of the present disclosure, the encapsulating layer may be formed directly on the organic polymer material layer and the protective layer to package the plurality of chips. After lifting off the transparent substrate, a second packaging process for a side of the plurality of chips close to the transparent substrate may be avoided. The process for the chip package may be simplified and a chip package efficiency may be improved. The plurality of alignment parts may improve the alignment accuracy and accuracy of the connection between the metal pins of the plurality of chips and the plurality of metal parts. Reliability of the entire chip package and a good yield ratio of the chip package may be improved correspondingly. Subsequent film layers may be formed and/or stacked on the transparent substrate, and the organic polymer material layer and the protective layer may be made of materials with a certain transparent rate. Damage on the plurality of chips in the subsequent cutting process may be avoided. The reliability of the entire chip package and the good yield ratio of the chip package may be improved further. The organic polymer material layer, the protective layer, and the encapsulating layer may together form an encapsulating structure for the chip package, to effectively prevent external matters (such as water and oxygen) from entering an inside of the chip package structure, and avoid influence of the external matters (such as water and oxygen) on performance of the plurality of chips. The organic polymer material layer may be used as a flexible substrate and may be formed by a current technical process. The flatness of the entire chip package structure may be improved and the transparent substrate may be lifted off easily by the laser. The efficiency of the entire chip package and the good yield ratio of the chip package may be improved further.

Figure 12:
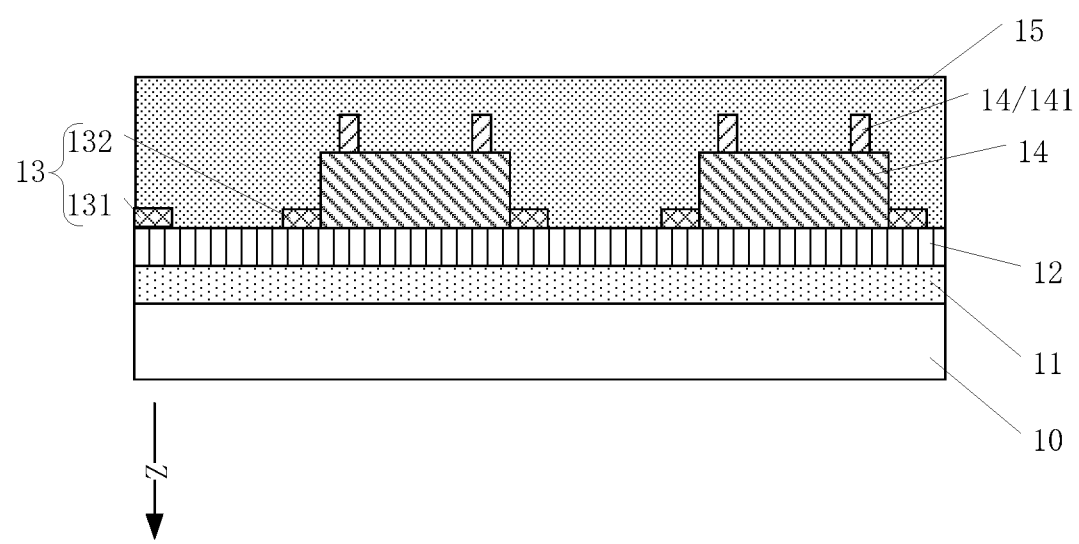
FIG. 12 illustrate a cross-section view of an exemplary chip package structure formed by the chip package method in FIG. 1 consistent with various disclosed embodiments in the present disclosure.

In one embodiment illustrated in FIG. 1 and FIG. 12, a process for forming the plurality of alignment parts 132 on the protective layer 12 may further include forming a general alignment part 131. The general alignment part 131 may be formed at the one side of the protective layer 12 away from the organic polymer material layer 11. The general alignment part 131 may be a general alignment label for the chip package process, and each of subsequent steps may be aligned according to the general alignment part 131. In one embodiment, the general alignment part 131 may be made of metal. For description purposes only, the present disclosure is illustrated by using the embodiment where the general alignment part 131 is made of metal as an example, and should not limit the scopes of the present disclosure. In various embodiments, the general alignment part 131 may be made of any suitable materials.

In the present disclosure, the general alignment part may be formed at the one side of the protective layer away from the organic polymer material layer, and each of subsequent steps may be aligned according to the general alignment part. The alignment accuracy of the chip package process may be improved. The reliability of the entire chip package structure and a good yield ratio of the chip package process may be improved.

In one embodiment illustrated in FIG. 12, each of the plurality of chips 14 may be in contact with at least two of the plurality of alignment parts 132, and the at least two of the plurality of alignment parts 132 may be at two different sides of the one of the plurality of chips 14.

As illustrated in FIG. 12, the plurality of alignment parts 132 may be formed at the one side of the protective layer 12 away from the transparent substrate 10. The plurality of alignment parts 132 may be used as dedicated alignment marks for the plurality of chips. When attaching the plurality of chips 14, the plurality of chips 14 may be attached precisely according to positions of the plurality of alignment parts 132. The attachment accuracy of the plurality of chips may be improved. The reliability of the entire chip package structure and a good yield ratio of the chip package process may be improved. In one embodiment, the plurality of alignment parts 132 may be made of metal. For description purposes only, the present disclosure is illustrated by using the embodiment where the plurality of alignment parts 132 is made of metal as an example, and should not limit the scopes of the present disclosure. In various embodiments, the plurality of alignment parts 132 may be made of any suitable materials.

In the present disclosure, the plurality of alignment parts 132 may be formed at the one side of the protective layer 12 away from the transparent substrate 10. The attachment accuracy of the plurality of chips may be improved, and the plurality of metal parts may be attached to the plurality of metal pins precisely. The reliability of the entire chip package structure and a good yield ratio of the chip package process may be improved.

Figure 13:
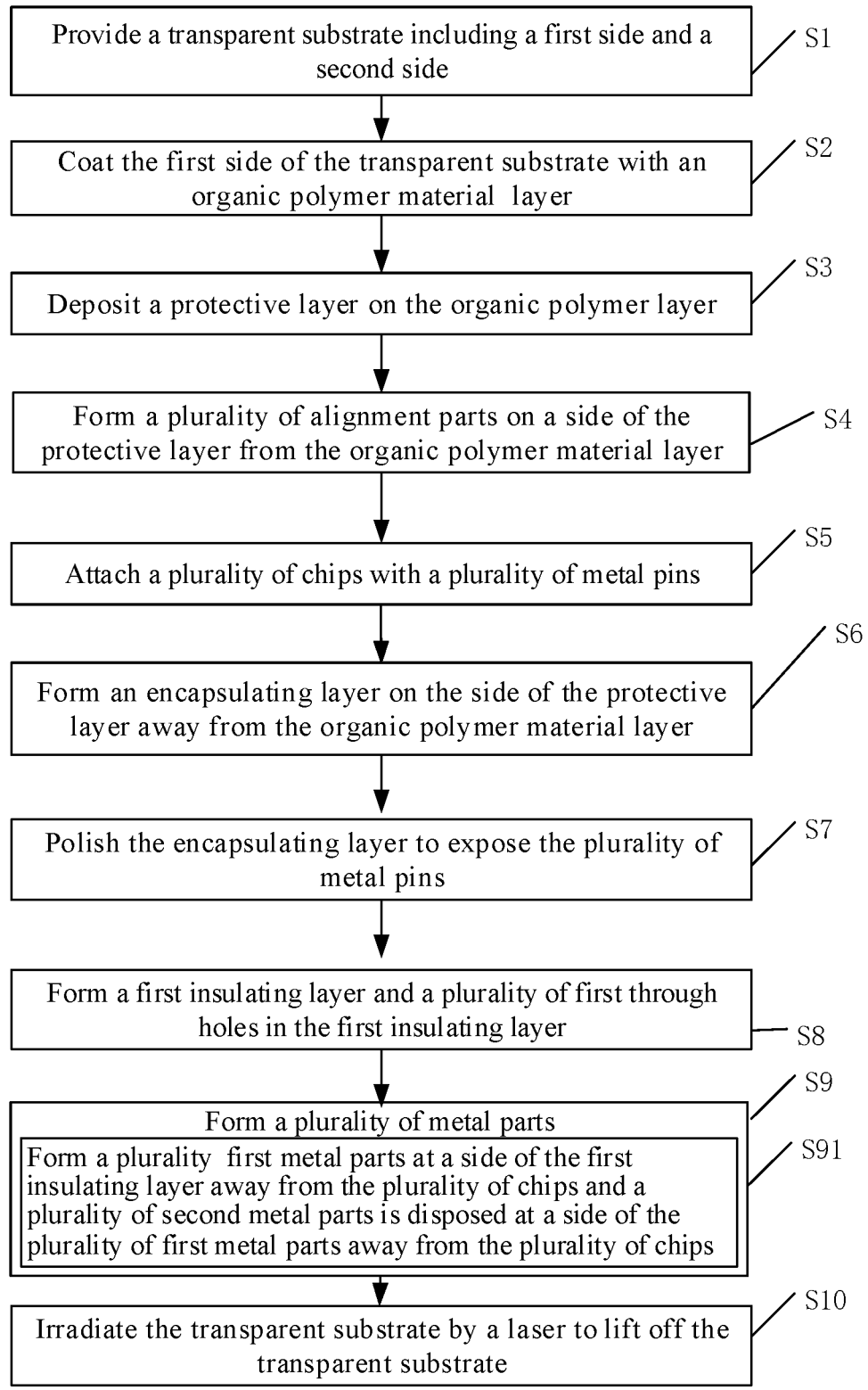
FIG. 13 illustrates another exemplary chip package method consistent with various disclosed embodiments in the present disclosure.
Figure 14:
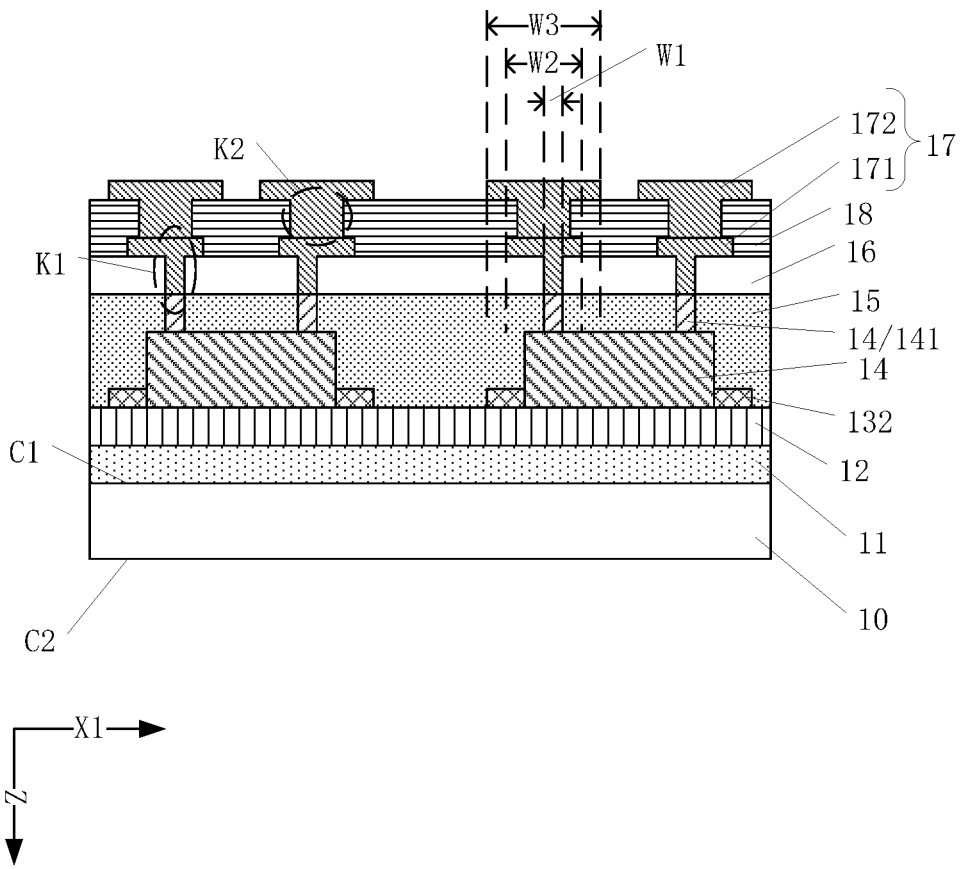
FIG. 14 illustrates a cross-section view of an exemplary chip package structure corresponding the chip package method in FIG. 13 consistent with various disclosed embodiments in the present disclosure.

FIG. 13 illustrates another exemplary chip package method provided by one embodiment in the present disclosure; and FIG. 14 illustrates a cross-section view of an exemplary chip package structure corresponding to the chip package method in FIG. 13. In one embodiment illustrated in FIGS. 13-14, the process for forming the plurality of metal parts 17 may include Step S91: forming a plurality of first metal parts 171 and a plurality of second metal parts 172. The plurality of first metal parts 171 may be formed at a side of the first insulating layer 161 away from the plurality of chips 14, and the plurality of second metal parts 172 may be formed at a side of the plurality of first metal parts 171 away from the plurality of chips 14. A second insulating layer 18 may be formed between the plurality of first metal parts 171 and the plurality of second metal parts 172. A plurality of second through holes K2 may be formed in the second insulating layer 18. Along the direction perpendicular to the organic polymer material layer 11, each of the plurality of first metal parts 171 may at least partially overlap corresponding one of the plurality of metal pins 141, and each of the plurality of second metal parts 172 may at least partially overlap corresponding one of the plurality of first metal parts 171. Each of the plurality of second metal parts 172 may be electrically connected to the corresponding one of the plurality of first metal parts 171 through corresponding one of the plurality of second through holes K2.

In the present disclosure, the process for forming the plurality of metal parts 17 may include forming the plurality of first metal parts 171 and the plurality of second metal parts 172. The second insulating layer 18 may be formed between the plurality of first metal parts 171 and the plurality of second metal parts 172. Each of the plurality of second metal parts 172 may be electrically connected to the corresponding one of the plurality of first metal parts 171, and each of the plurality of first metal parts 171 may be electrically connected to corresponding one of the plurality of metal pins 141 to transmit electric signals from the plurality of chips 14. Along a direction X1 parallel to the transparent substrate 10, a width W3 of the plurality of second metal parts 172 may be larger than a width W2 of the plurality of first metal parts 171, and the width W2 of the plurality of first metal parts 171 may be larger than a width W1 of the plurality of metal pins 141. The plurality of second metal parts 172 with the larger width W2 may provide a larger contact area. Correspondingly, transmission of electric signal when connecting the packaged chips to other circuits and/or products may be more stable and accurate.

In the present disclosure, when electrically connecting the packaged chips to other circuits and/or products, the plurality of second metal parts may provide a large contact area. Correspondingly, transmitted electric signals may be more accurate and usability of the chip package structure may be improved.

Figure 15:
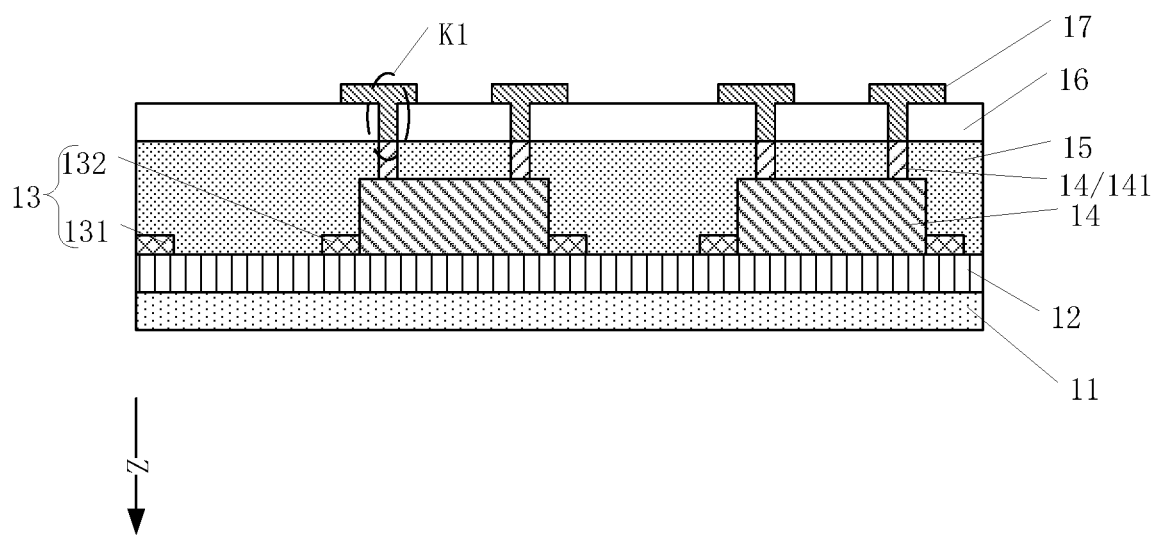
FIG. 15 illustrates a cross-section view of an exemplary chip package structure consistent with various disclosed embodiments in the present disclosure.

In one embodiment, the present disclosure provides a chip package structure formed by a chip package method provided by various embodiments of the present disclosure. FIG. 15 illustrates a cross-section view of an exemplary chip package structure provided by an embodiment in the present disclosure. As illustrated in FIG. 15, the chip package structure may include: an organic polymer material layer 11, a protective layer 12 covering the organic polymer material layer 11; a plurality of alignment parts 132 at a side of the protective layer 12 away from the organic polymer material layer 11; a plurality of chips 14; an encapsulating layer 151 at the one side of the protective layer 12 away from the organic polymer material layer 11; and a plurality of metal parts 17. The plurality of chips 14 and the plurality of alignment parts 132 may be disposed at a same side. The plurality of chips 14 may include a plurality of metal pins 141 at a side of the plurality of chips 141 away from the organic polymer material layer 11. The plurality of metal parts 17 may be disposed at a side of the encapsulating layer 15 away from the organic polymer material layer 11, and may be electrically connected to the plurality of metal pins 141.

In the chip package structure provided by various embodiments of the present disclosure, the organic polymer material layer 11 and the protective layer 12 may be used to substitute the encapsulating layer 15 at another side of the plurality of chips 14 without the plurality of metal pins 141. In one embodiment, the organic polymer material layer 11 may be made of polyimide. The organic polymer material layer 11 may be made of a coating method or another suitable method, and the whole packaging structure may have a high flatness after depositing the protective layer 12 on the organic polymer material layer 11. In one embodiment, the protective layer 12 and the organic polymer material layer 11 may be made of transparent materials. The plurality of alignment parts 132 may be formed on the one side of the protective layer 12 away from the organic polymer material layer 11, to improve alignment accuracy of subsequent processes. The encapsulating layer 15 may be formed at the one side of the protective layer 12 away from the organic polymer material layer 11. In one embodiment, the encapsulating layer 15 may be made of epoxy molding compound (EMC). The encapsulating layer 15 may prevent external matters (such as water and oxygen) from entering the plurality of chips 14, and avoid the influence of the external matters (such as water and oxygen) on the performance of the plurality of chips 14.

In the chip package structure provided by various embodiments of the present disclosure, the encapsulating layer may be formed directly on the organic polymer material layer and the protective layer to package the plurality of chips. After lifting off the transparent substrate, a second packaging process at a side of the plurality of chips close to the transparent substrate with EMC may be avoided. The process for the chip package may be simplified and a chip package efficiency may be improved. The plurality of alignment parts may improve the alignment accuracy and accuracy of the connection between the metal pins of the plurality of chips and the plurality of metal parts. Reliability of the entire chip package and a good yield ratio of the chip package may be improved correspondingly. Subsequent film layers may be formed and/or stacked on the transparent substrate, and the organic polymer material layer and the protective layer may be made of materials with a certain transparent rate. Damage on the plurality of chips in the subsequent cutting process may be avoided. The reliability of the entire chip package and the good yield ratio of the chip package may be improved further. The organic polymer material layer, the protective layer, and the encapsulating layer may together form an encapsulating structure for the chip package, to effectively prevent external matters (such as water and oxygen) from entering an inside of the chip package structure, and avoid influence of the external matters (such as water and oxygen) on performance of the plurality of chips. The organic polymer material layer may be used as a flexible substrate and may be formed by current technical process. The flatness of the entire chip package structure may be improved and the transparent substrate may be lifted off easily by the laser. The efficiency of the entire chip package and the good yield ratio of the chip package may be improved further.

In one embodiment illustrated in FIG. 15, each of the plurality of chips 14 may be in contact with at least two of the plurality of alignment parts 132, and the at least two of the plurality of alignment parts 132 may be at two different sides of the one of the plurality of chips 14.

In one embodiment illustrated in FIG. 15, a general alignment part 131 and the plurality of alignment parts 132 may be disposed at the one side of the protective layer 12 away from the transparent substrate 10. The general alignment part 131 may be used as a general alignment mark for the chip package process, and each of subsequent steps may be aligned according to the general alignment part 131. In one embodiment, the general alignment part 131 and the plurality of alignment parts 132 may be made of metal. For description purposes only, the present disclosure is illustrated by using the embodiment where the general alignment part 131 and the plurality of alignment parts 132 are made of metal as an example, and should not limit the scopes of the present disclosure. In various embodiments, the general alignment part 131 and the plurality of alignment parts 132 may be made of any suitable materials.

In the present disclosure, the general alignment part may be formed at the one side of the protective layer away from the organic polymer material layer, and each of subsequent steps may be aligned according to the general alignment part. The alignment accuracy of the chip package process may be improved. The reliability of the entire chip package structure and a good yield ratio of the chip package process may be improved.

In one embodiment illustrated in FIG. 15, the protective layer 12 may be made of a silicon-containing material including, e.g., a silicide. The protective layer 12 made of a silicide may have a small thickness to decrease the thickness of the chip package structure. The silicide may effectively isolate water and/or oxygen, and also have a good light transmission. Correspondingly, damage on the film layer structure when cutting/separating the plurality of chips may be avoided and a good yield ratio of the chip package process may be improved.

Figure 16:
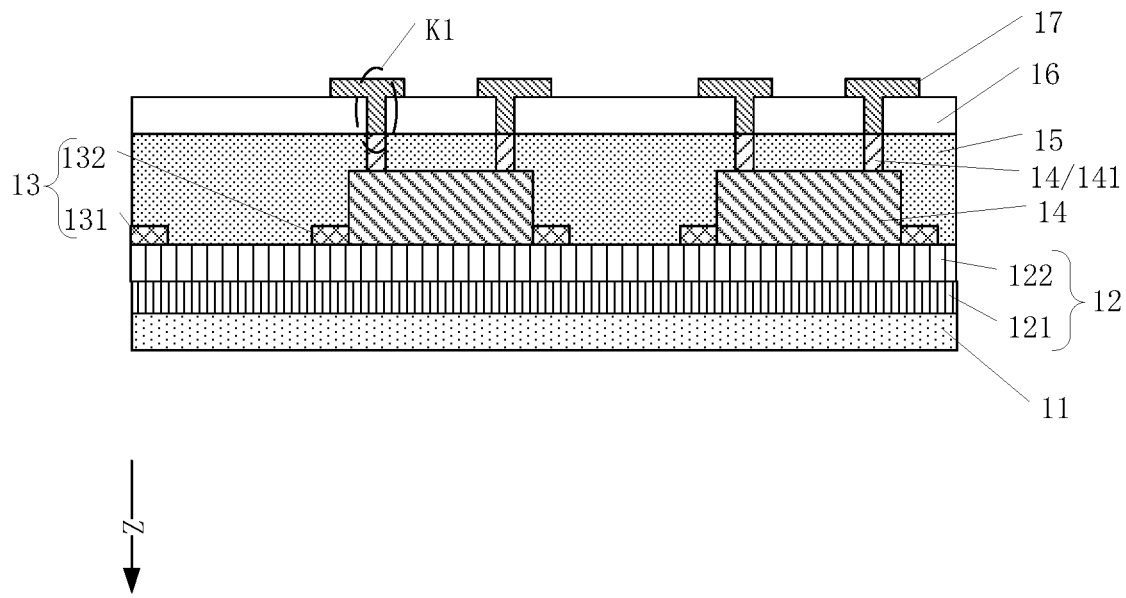
FIG. 16 illustrates a cross-section view of another exemplary chip package structure consistent with various disclosed embodiments in the present disclosure.

In another embodiment illustrated in FIG. 16, the protective layer 12 may include a first protective layer 121 and a second protective layer 122. The first protective layer 121 may be made of a silicon-containing material including silicides such as $SiO_2$ and SiN. The second protective layer 122 may be made of plastics. In one embodiment, the second protective layer 122 and the encapsulating layer 15 may be made of a same material. In another embodiment, the organic polymer material layer 11 may be multiplexed as a third protective layer. The organic polymer material layer 11 may be made of a flexible material such as polyimide and could be used as a buffer/protective layer.

In the present disclosure, the protective layer 12 may include the first protective layer 121 and the second protective layer 122. External matters (such as water and oxygen) may be effectively prevented from entering the plurality of chips 14. Correspondingly, reliability of the chip package structure may be improved and a life of the plurality of chips may be extended.

The encapsulating layer 15 may be made of a material including plastic. In one embodiment illustrated in FIG. 16, the encapsulating layer 15 may be made of epoxy molding compound (EMC). The encapsulating layer 15 may prevent external matters (such as water and oxygen) from entering the plurality of chips 14, and avoid the influence of the external matters (such as water and oxygen) on the performance of the plurality of chips 14.

In the present disclosure, the encapsulating layer may be made of plastic. Plastic technologies are mature, and a chip package cost may be reduced. External matters (such as water and oxygen) may be effectively prevented from entering the plurality of chips 14. Correspondingly, the reliability of the chip package structure may be improved and the life of the plurality of chips may be extended.

Figure 17:
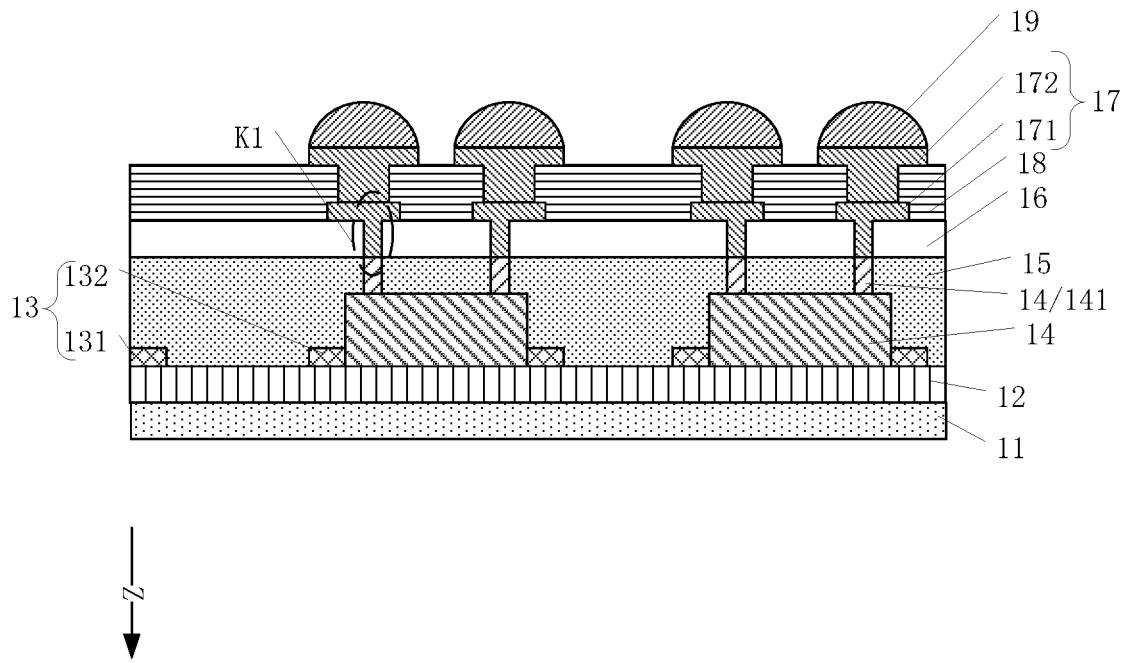
FIG. 17 illustrates a cross-section view of another exemplary chip package structure consistent with various disclosed embodiments in the present disclosure.

In another embodiment illustrated in FIG. 17, the chip package structure may further include metal balls 19. The metal balls 19 may be disposed on the one side of the plurality of metal parts 17 away from the organic polymer material layer 11.

In the present disclosure, the metal balls 19 may be disposed on the one side of the plurality of metal parts 17 away from the organic polymer material layer 11. Correspondingly, the packaged chips may be soldered to circuit boards and/or other circuits conveniently, and a usability of the packaged chips may be facilitated.

Figure 18:
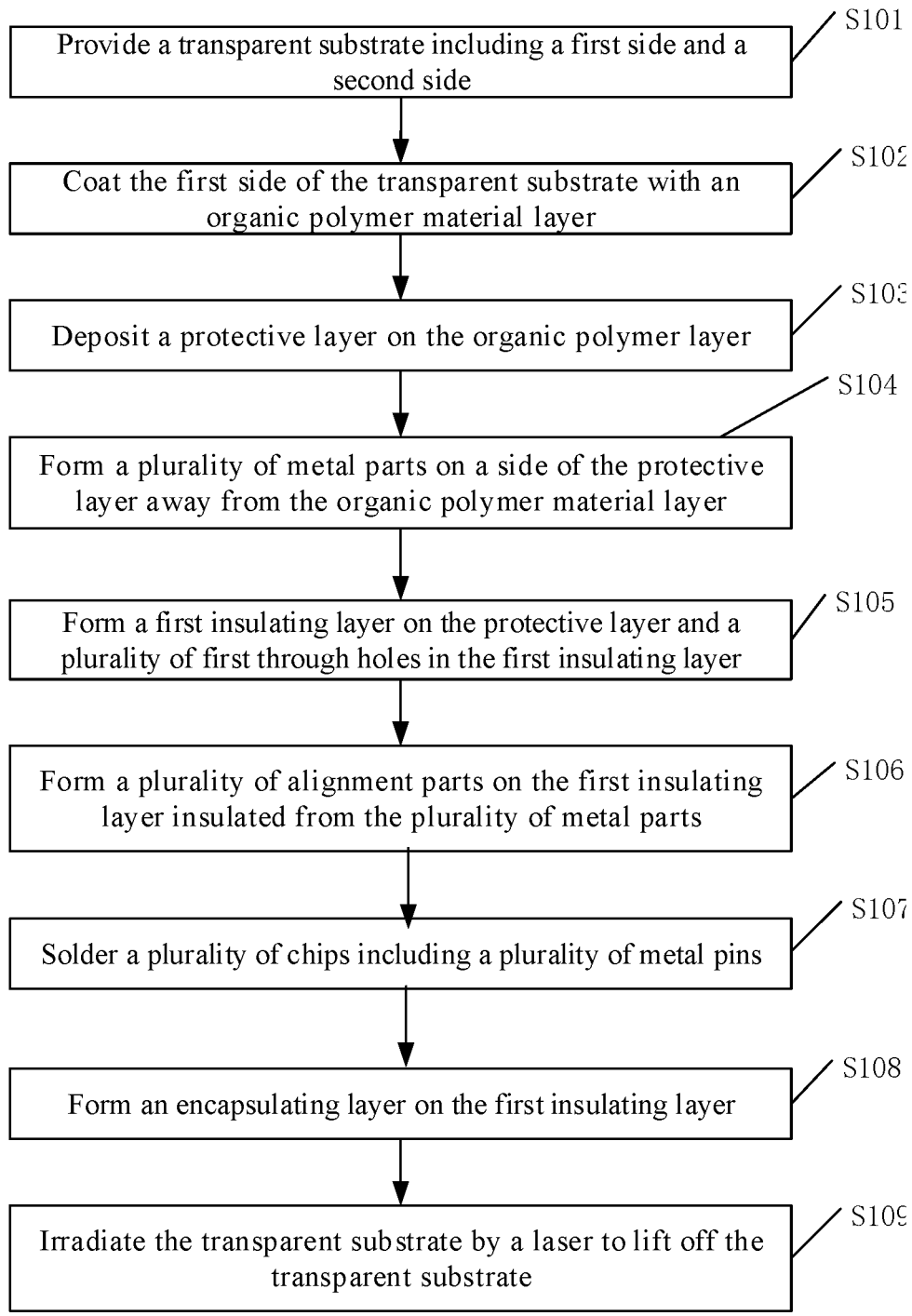
FIG. 18 illustrates another exemplary chip package method consistent with various disclosed embodiments in the present disclosure.

In another embodiment, the present disclosure also provides another chip package method. FIG. 18 illustrates another chip package method consistent with various disclosed embodiments in the present disclosure. FIGS. 19-28 illustrate cross-section views of the chip package structure corresponding to different steps in the chip package method in FIG. 18. As illustrated in FIGS. 18-28, the chip package method may include:

Step S101: providing a transparent substrate 10 including a first side C1 and a second side C2 opposite to the first side C1;

Step S102: coating the first side C1 of the transparent substrate 10 with an organic polymer material layer 11;

Step S103: depositing a protective layer 12 on the organic polymer material layer 11;

Step S104: forming a plurality of metal parts 17 on the protective layer 12;

Step S105: forming a first insulating layer 16 on a side of the protective layer 12 away from the transparent substrate 10, and forming a plurality of first through holes K1 in the first insulating layer 116;

Step S106: forming a plurality of alignment parts 132 on the first insulating layer 16;

Step S107: soldering a plurality of chips 14 including a plurality of metal pins 141;

Step S108: forming an encapsulating layer 15 at a side of the first insulating layer 16 away from the organic polymer material layer 11; and Step S109: irradiating the second side C2 of the transparent substrate 10 with a laser L to lift off the transparent substrate 10.

Figure 20:
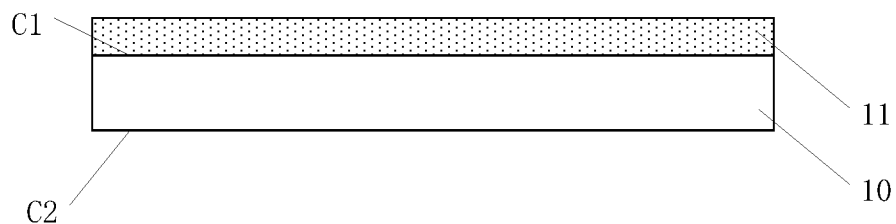

In Step S102, as illustrated in FIG. 18 and FIG. 20, the first side C1 of the transparent substrate 10 may be coated with the organic polymer material layer 11. In one embodiment, the organic polymer material layer 11 may be made of a material including polyimide.

Figure 21:
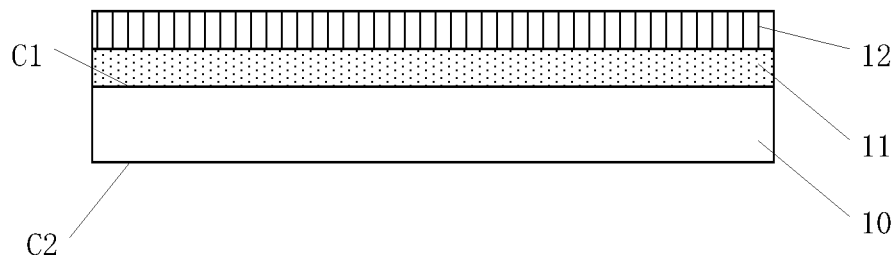

In Step S103, as illustrated in FIG. 18 and FIG. 21, the protective layer 12 may be deposited on the organic polymer material layer 11. In one embodiment, the protective layer 12 may be formed by a coating method. Correspondingly, the whole packaging structure may have a high flatness. In one embodiment, the protective layer 12 and the organic polymer material layer 11 may be made of transparent materials.

Figure 22:
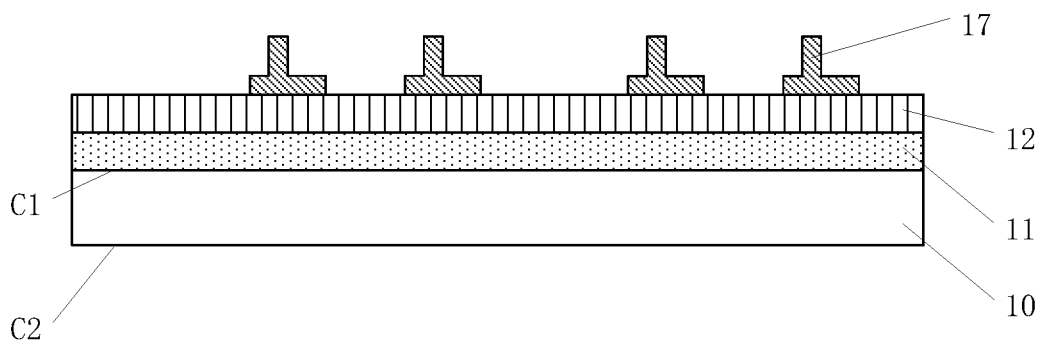

In Step S104, as illustrated in FIG. 18 and FIG. 22, the plurality of metal parts 17 may be formed on the one side of the protective layer 12 away from the transparent substrate 10. The plurality of metal parts 17 may be insulated from each other.

Figure 23:
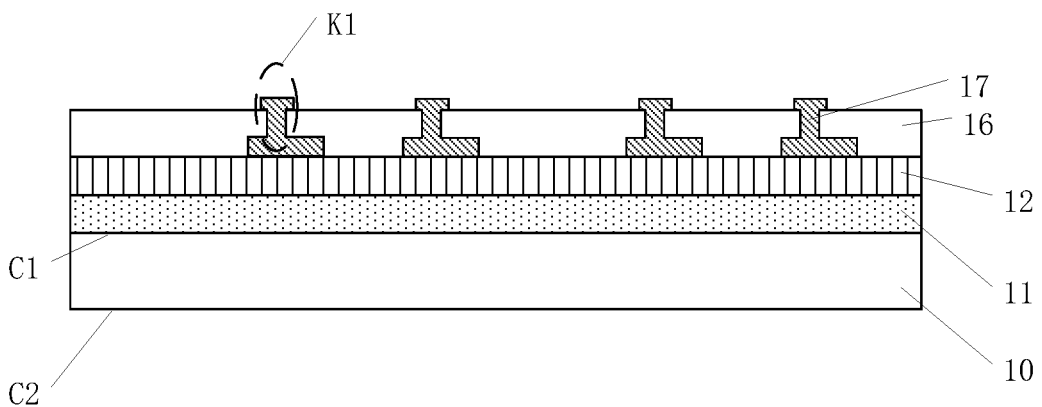

In Step S105, as illustrated in FIG. 18 and FIG. 23, a side of the plurality of metal parts 17 away from the transparent substrate 10 may be coated with the first insulating layer 16. The first insulating layer 16 may prevent short circuits between the plurality of metal parts 17 and other film layers. The first insulating layer 16 may also function as a buffer layer and may make the flatness of the entire chip package structure more uniform. The plurality of first through holes K1 may be formed in the first insulating layer 16. In one embodiment, an area of one of the plurality of metal parts 17 at the one side of the plurality of metal parts 17 away from the transparent substrate 10 may be larger than an area of a corresponding one of the plurality of metal pins 141, to guarantee an adequate contact area between the one of the plurality of metal parts 17 and the corresponding one of the plurality of metal pins 141.

Figure 24:
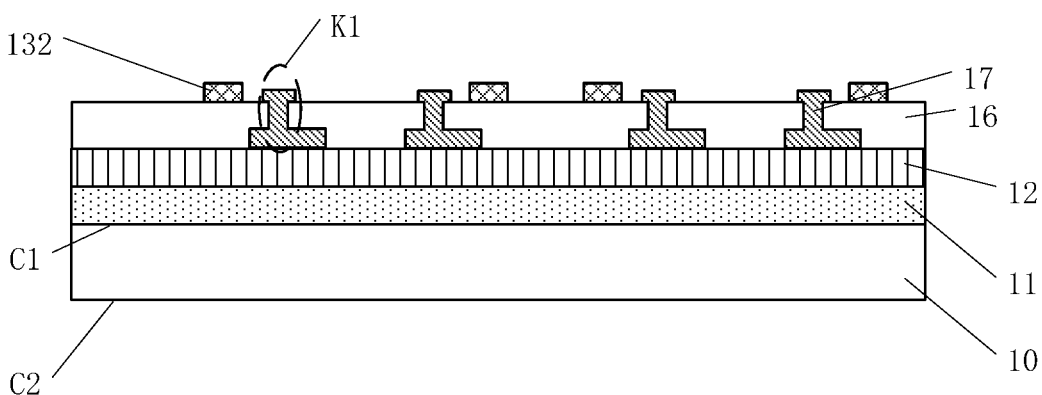

In Step S106, as illustrated in FIG. 18 and FIG. 24, the plurality of alignment parts 132 may be formed at the one side of the first insulating layer 16 away from the transparent substrate 10. The plurality of alignment parts 132 may be used as dedicated alignment marks for the plurality of chips. When attaching the plurality of chips 14, the plurality of chips 14 may be attached precisely according to positions of the plurality of alignment parts 132. The attachment accuracy of the plurality of chips may be improved. The reliability of the entire chip package structure and a good yield ratio of the chip package process may be improved. In one embodiment, the plurality of alignment parts 132 may be made of metal. For description purposes only, the present disclosure is illustrated by using the embodiment where the plurality of alignment parts 132 is made of metal as an example and should not limit the scopes of the present disclosure. In various embodiments, the plurality of alignment parts 132 may be made of any suitable materials.

Figure 25:
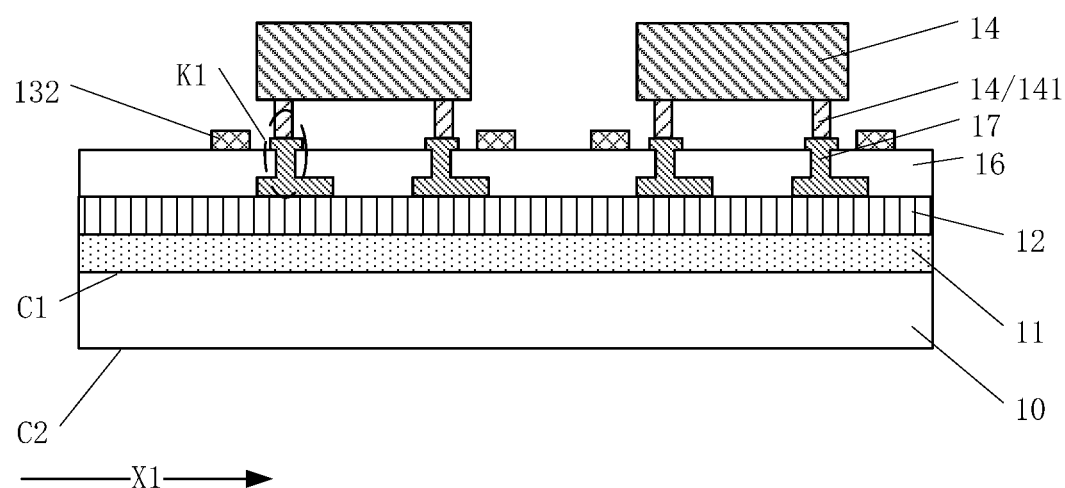

In Step S107, as illustrated in FIG. 18 and FIG. 25, along a direction Z perpendicular to the organic polymer material layer 11, each of the plurality of first through holes K1 may at least partially overlap a corresponding one of the plurality of metal pins 141. The plurality of metal parts 17 may extend along sidewalls of the plurality of first through holes K1, and may be insulated from each other. The plurality of metal parts 17 may be electrically connected to the plurality of metal pins 141 through the plurality of first through holes K1. In one embodiment, along a direction X1 parallel to the transparent substrate 10, a width of one of the plurality of metal parts 17 at another side of the plurality of metal parts 17 close to the plurality of metal pins 141 and at a position of the electrical connection between the one of the plurality of metal parts 17 and the corresponding one of the plurality of metal pins 141, may be larger than a width of the corresponding one of the plurality of metal pins 141, to guarantee an adequate contact area between the one of the plurality of metal parts 17 and the corresponding one of the plurality of metal pins 141. Reliability of signal transmission may be improved.

Figure 26:
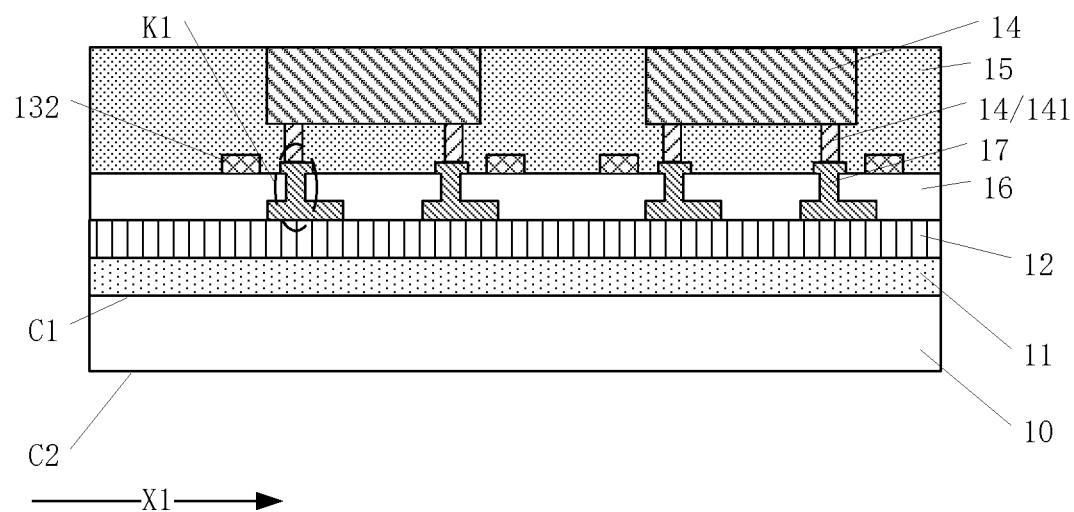

In Step S108, as illustrated in FIG. 18 and FIG. 26, the encapsulating layer 15 may be formed to prevent external matters (such as water and oxygen) from entering the plurality of chips 14, and avoid the influence of the external matters (such as water and oxygen) on the performance of the plurality of chips 14.

Figure 27:
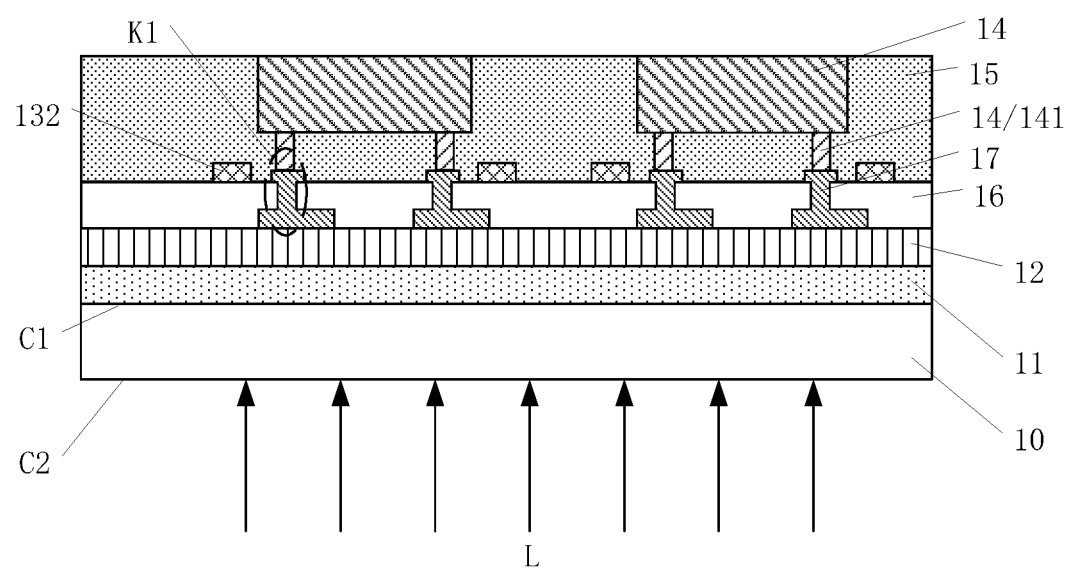
Figure 28:
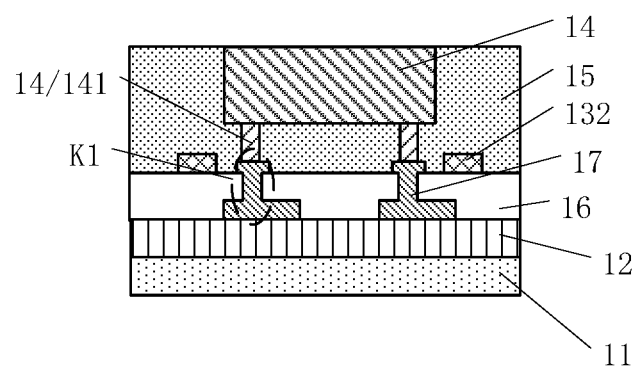

In Step S109 illustrated in FIG. 18 and FIGS. 27-28, the second side C2 of the transparent substrate 10 may be irradiated with a laser L to lift off the transparent substrate 10. In one embodiment, after lifting off the transparent substrate 10, the entire chip package structure may be cut by a laser cutting method, to separate the plurality of chips 14 packaged at a same time to a plurality of independently packaged chips.

In the chip package method provided by various embodiments of the present disclosure, the encapsulating layer may be formed directly on the organic polymer material layer and the protective layer to package the plurality of chips. After lifting off the transparent substrate, a second packaging process for a side of the plurality of chips close to the transparent substrate may be avoided. The process for the chip package may be simplified and a chip package efficiency may be improved. The plurality of alignment parts may improve the alignment accuracy and accuracy of the connection between the metal pins of the plurality of chips and the plurality of metal parts. Reliability of the entire chip package and a good yield ratio of the chip package may be improved correspondingly. Subsequent film layers may be formed and/or stacked on the transparent substrate, and the organic polymer material layer and the protective layer may be made of materials with a certain transparent rate. Damage on the plurality of chips in the subsequent cutting process may be avoided. The reliability of the entire chip package and the good yield ratio of the chip package may be improved further. The organic polymer material layer, the protective layer, and the encapsulating layer may together form an encapsulating structure for the chip package, to effectively prevent external matters (such as water and oxygen) from entering an inside of the chip package structure, and avoid influence of the external matters (such as water and oxygen) on performance of the plurality of chips. The organic polymer material layer may be used as a flexible substrate and may be formed by current technical process.

The flatness of the entire chip package structure may be improved and the transparent substrate may be lifted off easily by the laser. The efficiency of the entire chip package and the good yield ratio of the chip package may be improved further.

Figure 19:
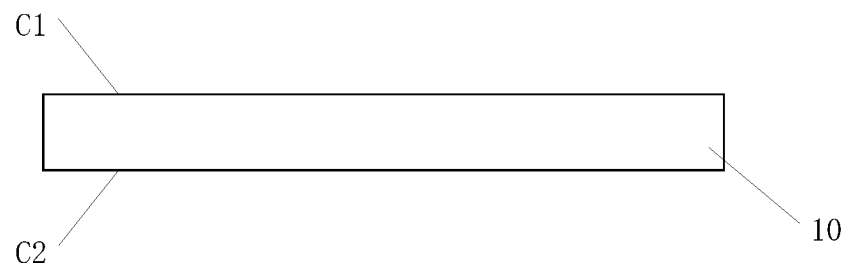
FIGS. 19-28 illustrate cross-section views of an exemplary chip package structure corresponding to different steps in the chip package method in FIG. 18 consistent with various disclosed embodiments in the present disclosure.
Figure 29:
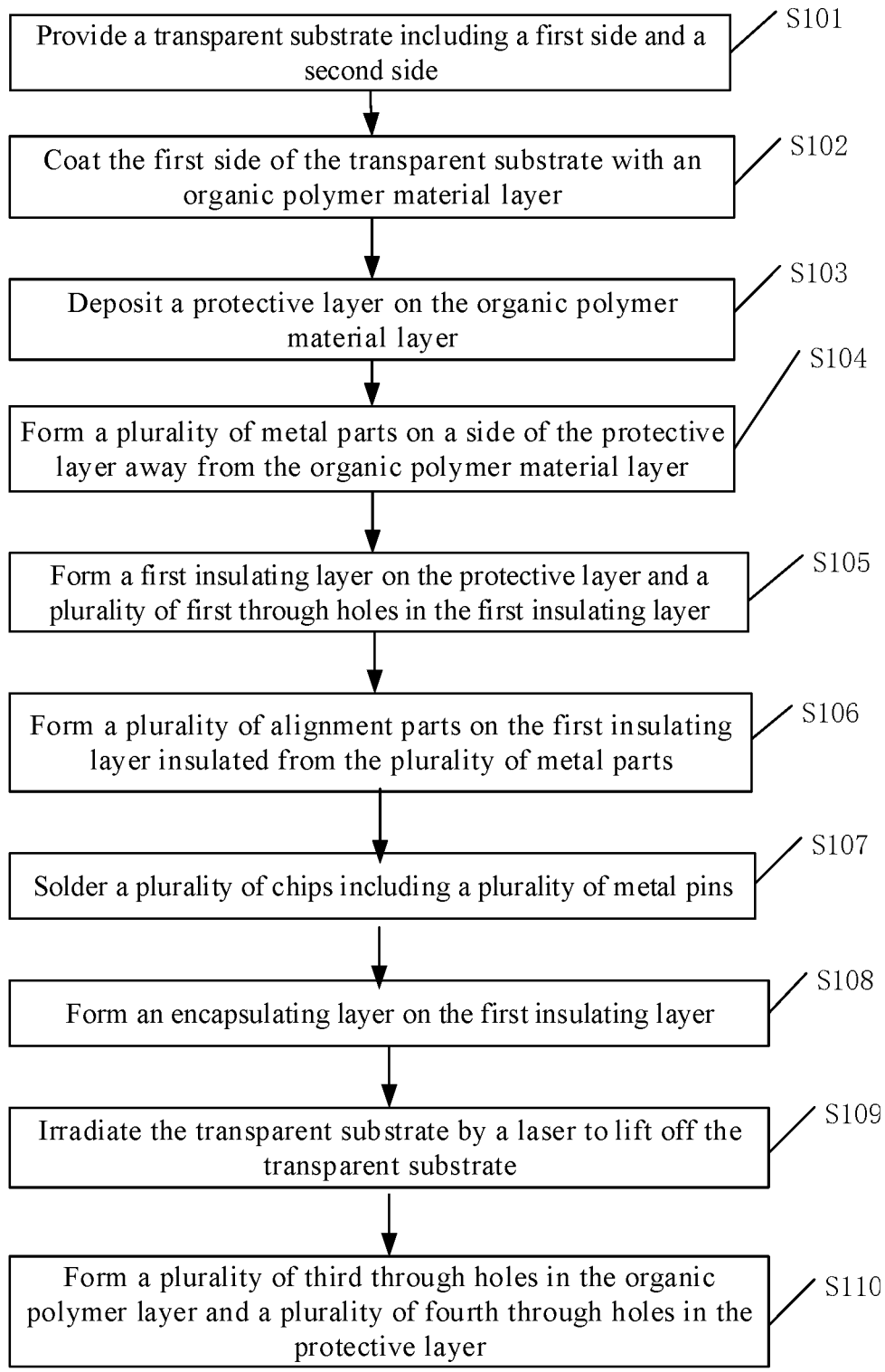
FIG. 29 illustrates another exemplary chip package method consistent with various disclosed embodiments in the present disclosure.
Figure 30:
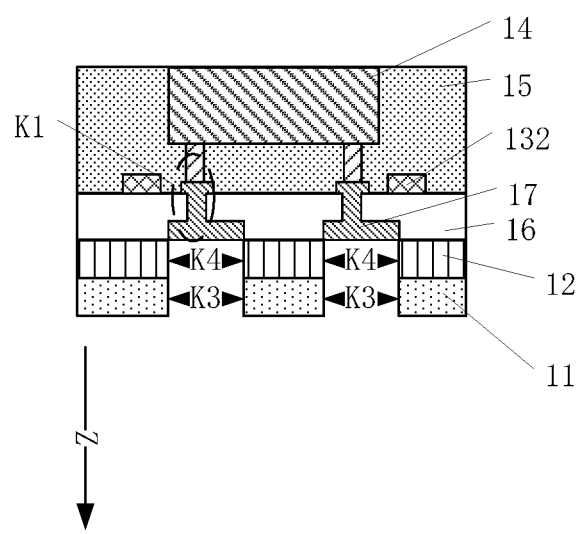
FIG. 30 illustrates a cross-section view of an exemplary chip package structure corresponding the chip package method in FIG. 29 consistent with various disclosed embodiments in the present disclosure.

Another embodiment of the present disclosure provides another chip package method illustrated in FIGS. 29-30. FIG. 19 illustrates another chip package method and FIG. 30 illustrates a cross-section view of the chip package structure corresponding to the chip package method in FIG. 29. As illustrated in FIGS. 29-30, the chip package method may further include:

Step S110: forming a plurality of third through holes K3 in the organic polymer material layer 11 and a plurality of fourth through holes K4 in the protective layer 12.

Along the direction Z perpendicular to the organic polymer material layer 11, each of the plurality of third through holes K3 may at least partially overlap a corresponding one of the plurality of metal parts 17, and each of the plurality of fourth through holes K4 may overlap a corresponding one of the plurality of third through holes K3.

As illustrated in FIGS. 29-30, the plurality of third through holes K3 and the plurality of fourth through holes K4 may be formed in the organic polymer material layer 11 and in the protective layer 12 respectively to expose the plurality of metal parts 17. Correspondingly, the plurality of metal parts 17 could be used to transmit the electric signals from the plurality of chips 14.

In the present disclosure, through holes may be formed in the organic polymer material layer 11 and in the protective layer 12 respectively to expose the plurality of metal parts 17. Correspondingly, the plurality of metal parts 17 could be used to transmit the electric signals from the plurality of chips 14. The forming process may be simple. The organic polymer material layer and the protective layer may prevent external matters such as water and oxygen from entering the chip package structure, and a packaging validity may be improved.

Figure 31:
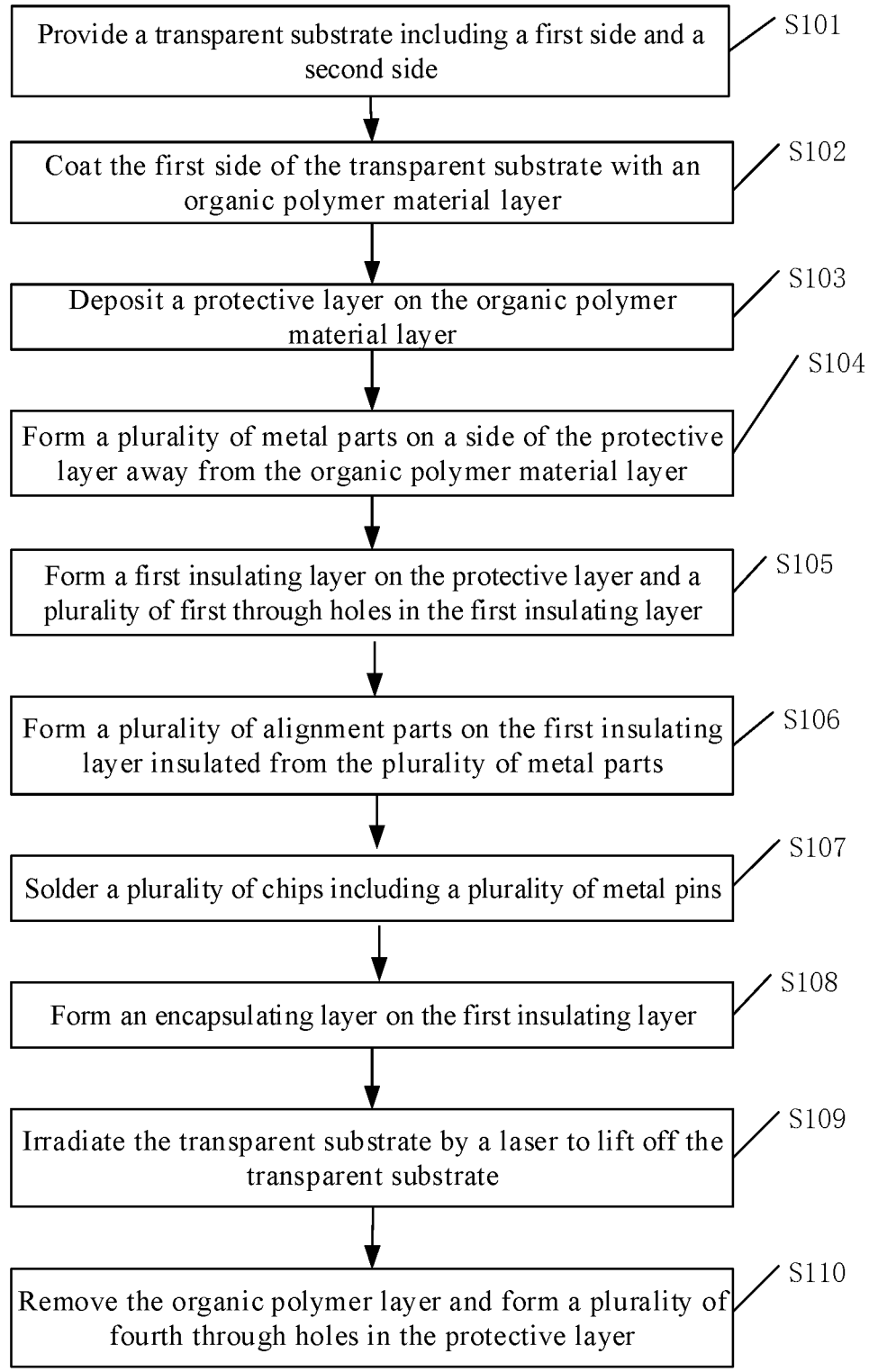
FIG. 31 illustrates another exemplary chip package method consistent with various disclosed embodiments in the present disclosure.
Figure 32:
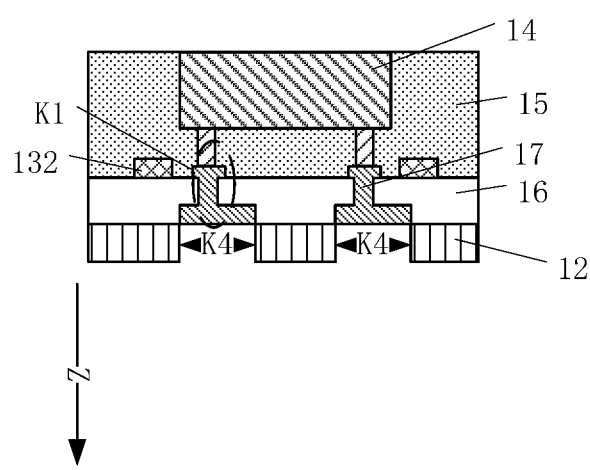
FIG. 32 illustrates a cross-section view of an exemplary chip package structure corresponding to the chip package method in FIG. 31 consistent with various disclosed embodiments in the present disclosure.

Another embodiment of the present disclosure provides another chip package method illustrated in FIGS. 31-32. FIG. 31 illustrates another chip package method and FIG. 32 illustrates a cross-section view of the chip package structure corresponding to the chip package method in FIG. 31. As illustrated in FIGS. 31-32, the chip package method may further include:

Step S111: lifting off the organic polymer material layer 11 and forming a plurality of fourth through hole K4 in the protective layer 12.

Along the direction Z perpendicular to the plurality of chips 14, each of the plurality of fourth through holes K4 may at least partially overlap a corresponding one of the plurality of metal parts 17.

As illustrated in FIGS. 31-32, the plurality of fourth through holes K4 may be formed in the protective layer 12 by a method including a polishing process, to expose the plurality of metal parts 17. Correspondingly, the plurality of metal parts 17 could be used to transmit the electric signals from the plurality of chips 14

In the present disclosure, the protective layer may prevent external matters such as water and oxygen from entering the chip package structure, and a packaging validity may be improved.

Figure 33:
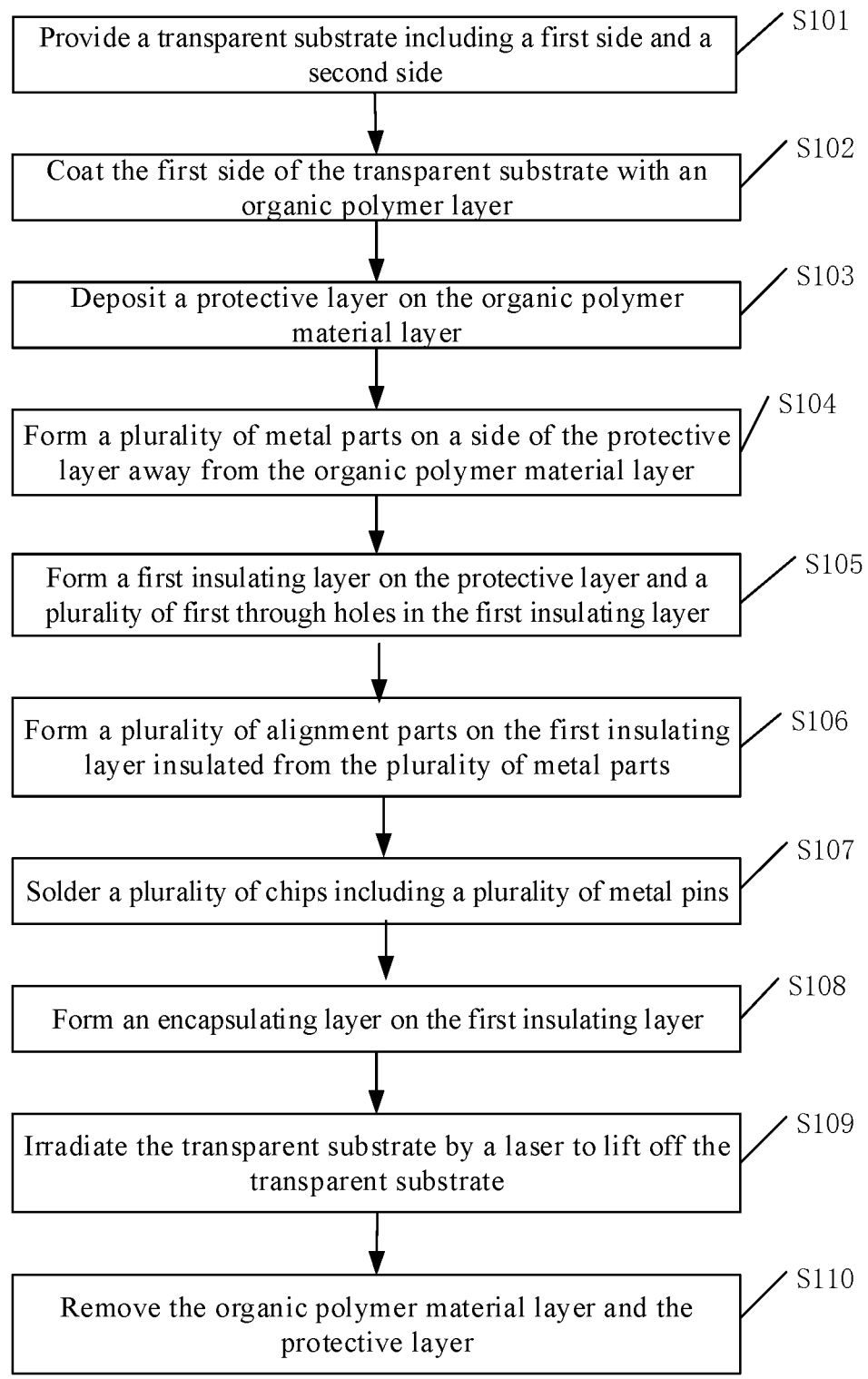
FIG. 33 illustrates another exemplary chip package method consistent with various disclosed embodiments in the present disclosure.
Figure 34:
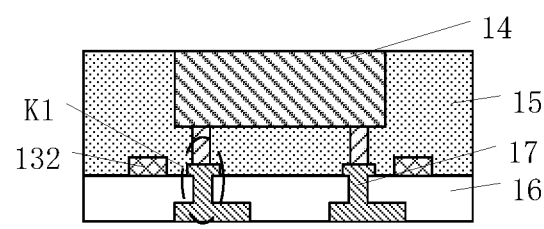
FIG. 34 illustrates a cross-section view of an exemplary chip package structure corresponding to the chip package method in FIG. 33 consistent with various disclosed embodiments in the present disclosure.

Another embodiment of the present disclosure provides another chip package method illustrated in FIGS. 33-34. FIG. 33 illustrates another chip package method and FIG. 34 illustrates a cross-section view of the chip package structure corresponding to the chip package method in FIG. 33. As illustrated in FIGS. 33-34, the chip package method may further include:

Step S111: lifting off the organic polymer material layer 11 and the protective layer 12.

As illustrated in FIGS. 33-34, since the encapsulating layer 15 may seal the plurality of chips 14 and the entire chip package structure may already have a high sealing degree, the organic polymer material layer 11 and the protective layer 12 may be lifted off, to reduce a thickness and a volume of the entire package structure.

Figure 35:
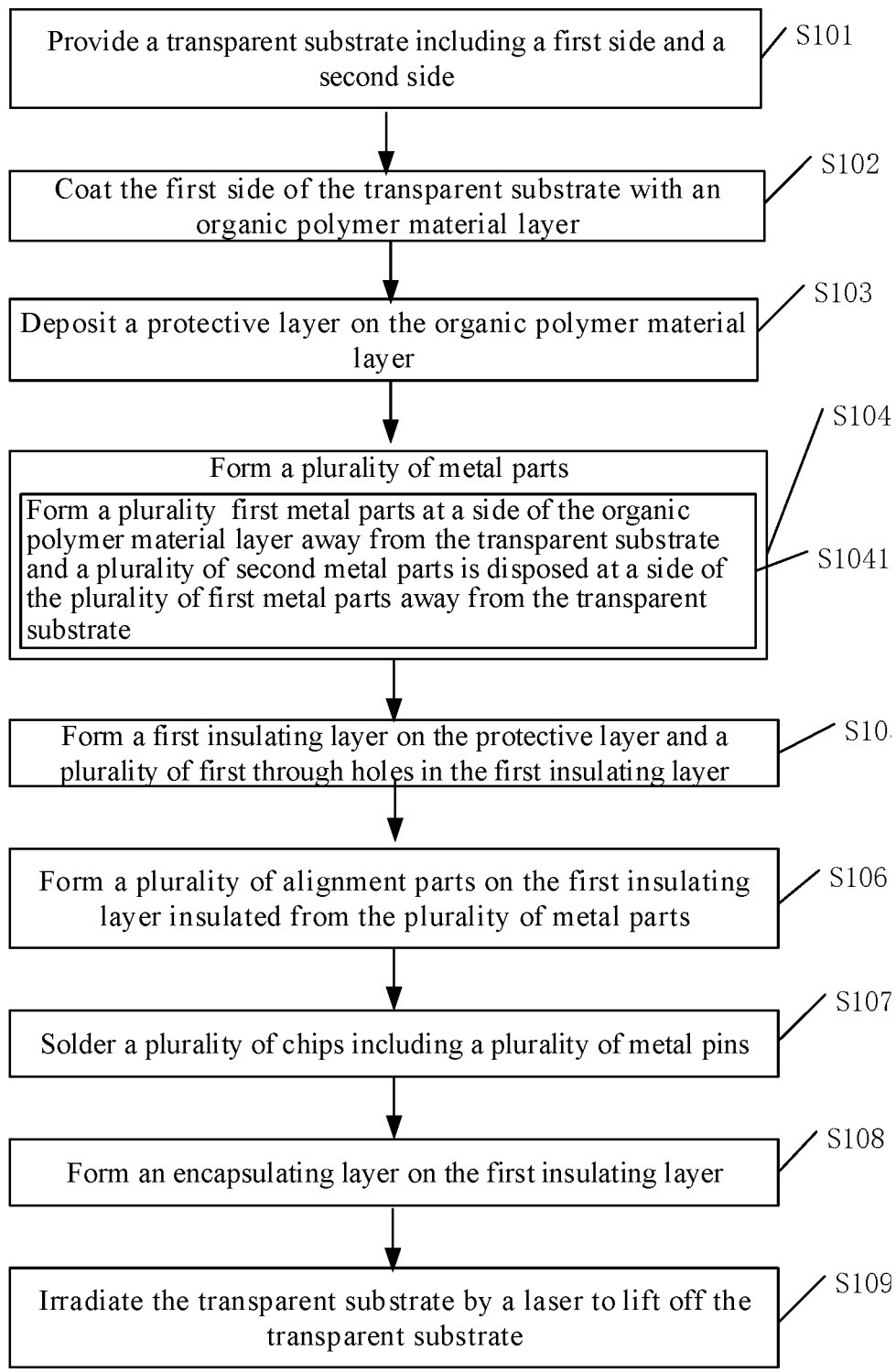
FIG. 35 illustrates another exemplary chip package method consistent with various disclosed embodiments in the present disclosure.
Figure 36:
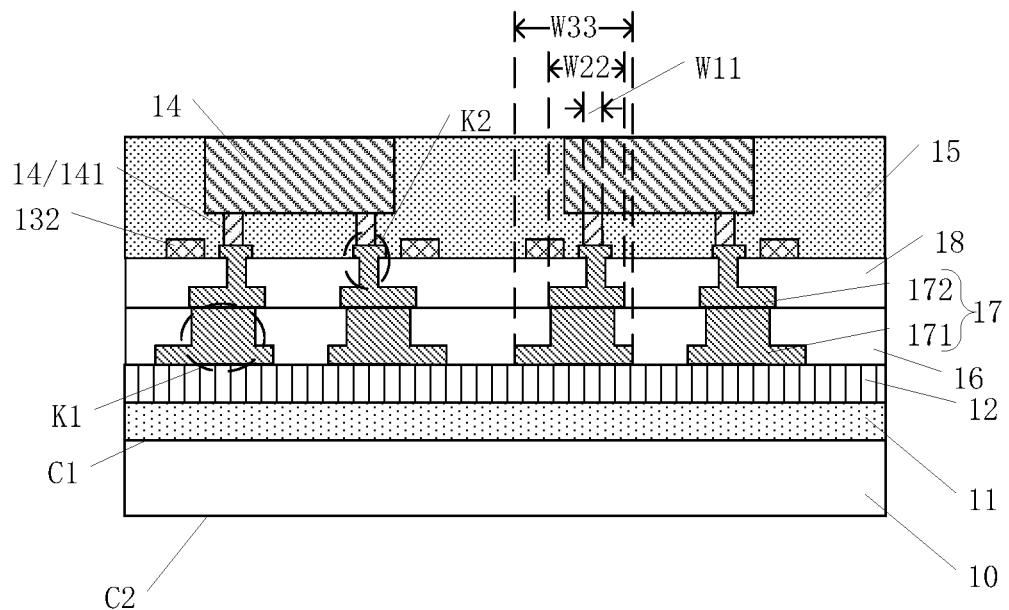
FIG. 36 illustrates a cross-section view of an exemplary chip package structure corresponding to the chip package method in FIG. 35 consistent with various disclosed embodiments in the present disclosure.

Another embodiment of the present disclosure provides another chip package method illustrated in FIGS. 35-36. FIG. 35 illustrates another chip package method and FIG. 36 illustrates a cross-section view of the chip package structure corresponding to the chip package method in FIG. 35. As illustrated in FIGS. 35-36, a process for forming the plurality of metal parts 17 in the chip package method may include:

Step S1041: forming a plurality of first metal parts 171 and a plurality of second metal parts 172. The plurality of first metal parts 171 may be formed at one side of the organic polymer material layer 11 away from the transparent substrate 10, and the plurality of second metal parts 172 may be formed at a side of the plurality of first metal parts 171 away from the transparent substrate 10. A second insulating layer 18 may be formed between the plurality of first metal parts 171 and the plurality of second metal parts 172. A plurality of second through holes K2 may be formed in the second insulating layer 18. A long the direction perpendicular to the organic polymer material layer 11, each of the plurality of first metal parts 171 may at least partially overlap a corresponding one of the plurality of metal pins 141, and each of the plurality of second metal parts 172 may at least partially overlap a corresponding one of the plurality of first metal parts 171. Each of the plurality of second metal parts 172 may be electrically connected to the corresponding one of the plurality of first metal parts 171 through corresponding one of the plurality of second through holes K2.

As illustrated in FIGS. 35-36, along a direction X1 parallel to the transparent substrate 10, a width W33 of the plurality of first metal parts 171 may be larger than a width W22 of the plurality of second metal parts 172, and the width W22 of the plurality of second metal parts 172 may be larger than a width W11 of the plurality of metal pins 141. The plurality of first metal parts 171 with the larger width may provide a larger contact area. Correspondingly, transmission of electric signal when connecting the packaged chips to other circuits and/or products may be more stable and accurate.

In the present disclosure, the process for forming the plurality of metal parts 17 may include forming the plurality of first metal parts 171 and the plurality of second metal parts 172. The second insulating layer 18 may be formed between the plurality of first metal parts 171 and the plurality of second metal parts 172. Each of the plurality of second metal parts 172 may be electrically connected to the corresponding one of the plurality of first metal parts 171, and each of the plurality of first metal parts 171 may be electrically connected to a corresponding one of the plurality of metal pins 141 to transmit electric signals from the plurality of chips 14.

In the present disclosure, the plurality of first metal parts and the plurality of second metal parts may be used to extract the electric signals from the plurality of chips, and the plurality of first metal parts with the larger width may provide a large contact area. Correspondingly, transmitted electric signals may be more accurate and usability of the chip package structure may be improved.

Figure 37:
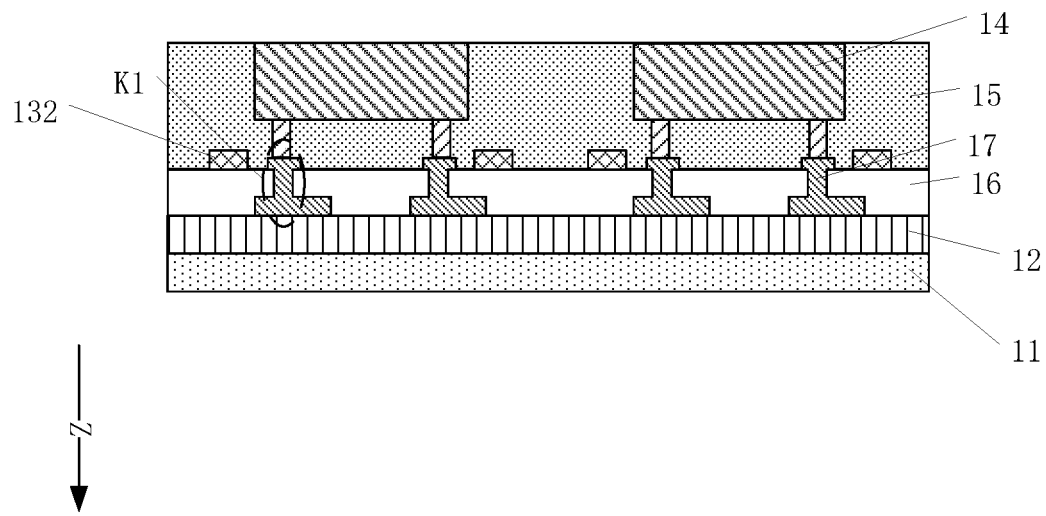
FIG. 37 illustrates a cross-section view of an exemplary chip package structure consistent with various disclosed embodiments in the present disclosure.

Another embodiment of the present disclosure provides another chip package structure illustrated in FIG. 37. As illustrated in FIG. 37 showing a cross-section views of an exemplary chip package structure provided by an embodiment in the present disclosure, the chip package structure may include: an organic polymer material layer 11, a protective layer 12 covering the organic polymer material layer 11; a plurality of metal parts 17 at a side of the protective layer 12 away from the organic polymer material layer 11; a plurality of alignment parts 132 at the one side of the protective layer 12 away from the organic polymer material layer 11; a plurality of chips 14; and an encapsulating layer 151 at a side of the plurality of metal parts 17 away from the organic polymer material layer 11. The plurality of metal parts 17 and the plurality of alignment parts 132 may be disposed at a same side. The plurality of chips 14 may be disposed at the one side of the plurality of metal parts 17 away from the organic polymer material layer 11 and may include a plurality of metal pins 141 at a side of the plurality of chips 141 away from the organic polymer material layer 11. The plurality of metal parts 17 may be electrically connected to the plurality of metal pins 141.

As illustrated in FIG. 37, the first side C1 of the transparent substrate 10 may be coated with the organic polymer material layer 11. In one embodiment, the organic polymer material layer 11 may be made of polyimide. The organic polymer material layer 11 may be made of a coating method or another suitable method, and the whole packaging structure may have a high flatness after depositing the protective layer 12 on the organic polymer material layer 11. In one embodiment, the protective layer 12 and the organic polymer material layer 11 may be made of transparent materials. The plurality of metal parts 17 may be formed on the one side of the protective layer 12 away from the organic polymer material layer 11, and the plurality of alignment parts 132 may be formed at the one side of the first insulating layer 16 away from the transparent substrate 10, to improve alignment accuracy of subsequent processes. The plurality of alignment parts 132 may be used as dedicated alignment marks for the plurality of chips. When attaching the plurality of chips 14, the plurality of chips 14 may be attached precisely according to positions of the plurality of alignment parts 132. The attachment accuracy of the plurality of chips may be improved. The reliability of the entire chip package structure and a good yield ratio of the chip package process may be improved. In one embodiment, the plurality of alignment parts 132 may be made of metal. For description purposes only, the present disclosure is illustrated by using the embodiment where the plurality of alignment parts 132 is made of metal as an example, and should not limit the scopes of the present disclosure. In various embodiments, the plurality of alignment parts 132 may be made of any suitable materials. The encapsulating layer 15 may be formed to seal the plurality of chips 14. The encapsulating layer 15 may prevent external matters (such as water and oxygen) from entering the plurality of chips 14, and avoid the influence of the external matters (such as water and oxygen) on the performance of the plurality of chips 14. The second side C2 of the transparent substrate 10 may be irradiated with a laser L to lift off the transparent substrate 10. In one embodiment, after lifting off the transparent substrate 10, the entire chip package structure may be cut by a laser cutting method, to separate the plurality of chips 14 packaged at the same time to a plurality of independently packaged chips.

In the chip package structure provided by various embodiments of the present disclosure, the encapsulating layer may be formed directly on the organic polymer material layer and the protective layer to package the plurality of chips. After lifting off the transparent substrate, a second packaging process at a side of the plurality of chips close to the transparent substrate with EMC may be avoided. The process for the chip package may be simplified and a chip package efficiency may be improved. The plurality of alignment parts may improve the alignment accuracy and the accuracy of the connection between the metal pins of the plurality of chips and the plurality of metal parts. The reliability of the entire chip package and a good yield ratio of the chip package may be improved correspondingly. Subsequent film layers may be formed and/or stacked on the transparent substrate, and the organic polymer material layer and the protective layer may be made of materials with a certain transparent rate. Damage on the plurality of chips in the subsequent cutting process may be avoided. The reliability of the entire chip package and the good yield ratio of the chip package may be improved further. The organic polymer material layer, the protective layer, and the encapsulating layer may together form an encapsulating structure for the chip package, to effectively prevent external matters (such as water and oxygen) from entering an inside of the chip package structure, and avoid influence of the external matters (such as water and oxygen) on performance of the plurality of chips. The organic polymer material layer may be used as a flexible substrate and may be formed by the current technical process. The flatness of the entire chip package structure may be improved and the transparent substrate may be lifted off easily by the laser. The efficiency of the entire chip package and the good yield ratio of the chip package may be improved further.

In one embodiment illustrated in FIG. 37, along the direction Z perpendicular to the organic polymer material layer 11, an orthographic projection of each of the plurality of chips 14 to the organic polymer material layer 11 may contact orthographic projection of the at least two of the plurality of alignment parts 132 to the organic polymer material layer 11, and the at least two of the plurality of alignments parts 132 may be at different sides of the corresponding one of the plurality of chips 14.

As illustrated in FIG. 37, the plurality of alignment parts 132 may be used as dedicated alignment marks for the plurality of chips. When attaching the plurality of chips 14, the plurality of chips 14 may be attached precisely according to positions of the plurality of alignment parts 132. The plurality of metal pins 141 of the plurality of chips 14 may be precisely connected to the plurality of metal parts 17. The reliability of the entire chip package structure and a good yield ratio of the chip package process may be improved.

Figure 38:
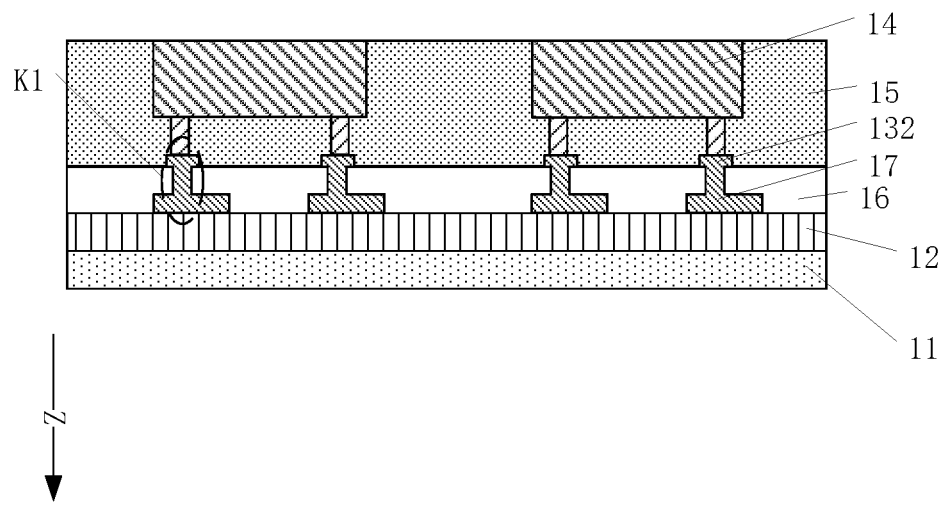
FIG. 38 illustrates a cross-section view of another exemplary chip package structure consistent with various disclosed embodiments in the present disclosure.

Another embodiment of the present disclosure provides another chip package structure illustrated in FIG. 38. As illustrated in FIG. 38 showing a cross-section views of an exemplary chip package structure, the plurality of metal parts 17 may be multiplexed as the plurality of alignment parts 132.

As illustrated in FIG. 38, the one side of the plurality of metal parts 17 away from the transparent substrate 10 may be exposed and may be electrically connected to the plurality of metal pins 141 to extract the electric signals from the plurality of chips 14. Correspondingly, an exposed portion of the plurality of metal parts 17 may be multiplexed as the plurality of alignment parts 132. The exposed portion of the plurality of metal parts 17 may be multiplexed as the plurality of alignment parts. A process of the chip package method may be simplified and the efficiency of the chip package method may be improved.

Figure 39:
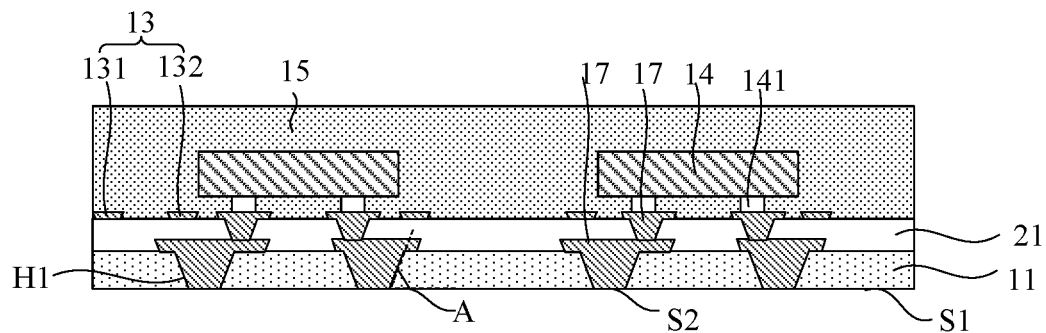
FIG. 39 illustrates another exemplary chip package structure consistent with various disclosed embodiments in the present disclosure.

FIG. 39 illustrates another exemplary chip package structure consistent with various disclosed embodiments in the present disclosure. As shown in FIG. 39, the chip package structure includes: a chip 14, including metal pins 141; an organic polymer material layer 11, the organic polymer material layer 11 being located on a side of the metal pins 141 away from the chip 14, the organic polymer material layer 11 including a first via hole H1, and the organic polymer material layer 11 including a first surface S1 away from the chip 14; metal parts 17, at least a portion of the metal parts being located in the first via hole, the metal parts 17 and metal pins 141 being electrically connected, the metal parts 17 including a second surface S2 away from the chip 14, and the second surface S2 and the first surface S1 being flush to each other; an encapsulating layer 15, the encapsulating layer 15 being located on a side of the metal parts 17 away from the organic polymer material layer 11.

Specifically, as shown in FIG. 39, the organic polymer material layer 11 may be used as another layer of the sealing structure in place of the encapsulating layer 15 when the chip 14 is packaged. Optionally, the organic polymer material layer 11 may be a light-transmitting material. Further, the organic polymer material layer 11 may be polyimide. The material of the encapsulating layer 15 includes epoxy resin molding compound (EMC). Optionally, the encapsulating layer 15 may cover the chip 14 and protect a side of the chip 14 away from the organic polymer material layer 11 and sidewalls of the chip 14. The encapsulating layer 15 may also provide a heat dissipation path for the chip 14. The chip 14 may be a die made from a wafer using a wafer-level process. The chip 14 may be provided with metal pins 141, and the metal pins 141 are electrically connected to the metal parts 17. In addition, the number of metal pins 141 is two as shown in FIG. 39, and the number of metal pins 141 can also be 3, 4, 5, 7, and so on.

The organic polymer material layer 11 may be formed first, and the formed organic polymer material layer 11 is located on a side of the metal pins 141 away from the chip 14. The organic polymer material layer 11 includes the first surface S1 away from the chip 14 and the third surface close to the chip 14. The first via hole H1 may be formed by patterning on the organic polymer material layer 11, and the first via hole H1 may be lithographically formed on the organic polymer material layer 11. Then, the metal parts 17 are formed. The metal parts 17 are at least partially located in the first via hole H1, and the metal parts 17 extend along the sidewalls of the first via hole H1. The metal parts 17 may be formed by electroplating and photolithography. The metal parts 17 may also be formed by deposition and photolithography. The metal parts 17 include the second surface S2 far away from the chip 14 and a fourth surface close to the chip 14. The second surface S2 of the metal parts 17 is flush with the first surface S1 of the organic polymer material layer 11. It should be noted that, to be more precise, the second surface S2 of the metal parts 17 and the first surface S1 of the organic polymer material layer 11 are substantially flush with each other. The second surface S2 of the metal parts 17 will be slightly higher than the first surface S1 of the organic polymer layer 11 in a direction perpendicular to the organic polymer material layer 11. Further, at least one chip 14 is provided. For example, two chips 14 are illustrated in FIG. 39. The number of chip 14 can also be 1, 3, 4, or more. The at least one chip 14 includes metal pins 141. When multiple chips 14 are provided, after the chip package structure is formed, cutting can be performed, such that each section of the chip package structure where each chip 14 is located can be used as an independent chip package structure, or multiple chips 14 together form the chip package structure. An encapsulating layer 15 is formed on the chip 14. The encapsulating layer 15 is located on a side of the metal parts 17 away from the organic polymer material layer 11. The encapsulating layer 15 is polished to expose the metal pins 141 of the chip 14, and the metal pins 141 are electrically connected to the metal parts 17.

It should be noted that in present disclosure, the chip package structure can be formed on a rigid substrate. The rigid substrate can be a transparent substrate 10. The transparent substrate 10 may be irradiated with a laser on a side of the transparent substrate 10 away from the organic polymer material layer 11, such that the transparent substrate 10 is peeled off to form the chip package structure. When the organic polymer material layer 11 is formed, it can be formed by coating. In addition, the formed metal parts 17 may have a one-layer structure. When the metal parts 17 have a one-layer structure, the fourth surface of the metal parts 17 is higher than the third surface of the organic polymer material layer 11. The third surface of the metal parts 17 and the metal pins 141 are electrically connected. Alternatively, the metal parts 17 may have a multiple-layer structure, for example, two layers. In this case, an insulating layer may be formed between the two layers of metal parts 17. The insulating layer may be in contact with the organic polymer material layer 11. Insulating layer via hole may be formed in the insulating layer. The metal parts 17 are at least partially located in the insulating layer via hole, and extends along the sidewalls of the insulating layer via hole. The two layers of metal parts 17 are electrically connected through the insulating layer via hole and further electrically connected to the metal pins 141. The number of layers of the metal parts 17 can also be three, four, five, or more. In practical applications, the number of layers of the metal parts 17 can be determined according to the size of the chip package structure, the size of the chip 14 and the process accuracy requirement.

In present disclosure, the encapsulating layer 15 is directly formed on the organic polymer material layer 11 to encapsulate the chip 14, such that re-encapsulation in the chip package structure is not needed, the overall chip package process is reduced, and the efficiency of chip package process is improved. When the chip package structure is made, the metal parts 17 are directly formed on the organic polymer material layer 11, such that the metal parts 17 can directly lead the electrical signal of the chip 14 from the metal pins 141 and the manufacturing process is simplified. The organic polymer material layer 11 and the encapsulating layer 15 together constitutes the sealing part of the entire chip package structure, which may effectively isolate external substances, such as water and oxygen, from entering the inside of the chip package structure and protect the chip 14 from the influence of external substances.

As shown in FIG. 39, a dimension of the first via hole H1 on a side close to the chip 14 is larger than a dimension of the first via hole H1 on the side away from the chip 14.

Specifically, the first via hole H1 is formed in the organic polymer material layer 11, and the dimension of the first via hole H1 on the side close to the chip 14 is different from the dimension of the first via hole H1 on the side away from the chip 14. The dimension of the first via hole H1 on the side close to the chip 14 is larger than the dimension of the first via hole H1 on the side away from the chip 14. That is, an angle between the outer surface of the first via hole H1 and the first surface S1 of the organic polymer material layer 11 is less than 90°. In addition, it should be noted that it is also possible that the dimension of the first via hole H1 on the side close to the chip 14 is smaller than the dimension of the first via hole H1 on the side away from the chip 14. The first via hole H1 may be formed this way because, after the chip package structure is formed, photolithography is performed on the side of the organic polymer material layer 11 away from the chip 14 to form the first via hole H1. In one embodiment, due to the characteristics of the photolithography process, the shape and structure of the first via hole H1 may be formed as described.

Figure 40:
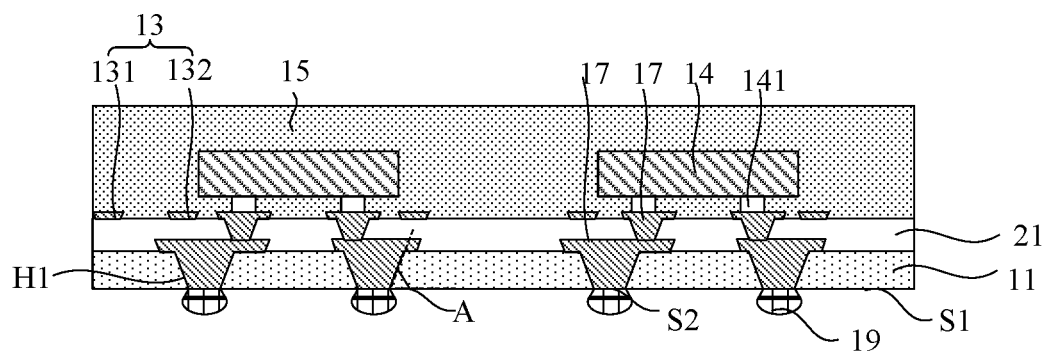
FIG. 40 illustrates another exemplary chip package structure consistent with various disclosed embodiments in the present disclosure.

FIG. 40 illustrates another exemplary chip package structure consistent with various disclosed embodiments in the present disclosure. The chip package structure further includes a metal ball 19 located on the side of the metal parts 17 away from the chip 14 and electrically connected to the metal parts 17.

Specifically, the metal ball 19 is located on the side of the metal and away from the chip 14 to realize the electrical connection between the chip 14 and an external circuit. The metal ball 19 may be made of metal such as tin, lead, copper, silver, gold, or an alloy thereof. In present disclosure, the metal ball 19 is formed on the side of the metal parts 17 away from the organic polymer material layer 11, so that the packaged chip 14 can be easily soldered to a circuit board or other electronic circuit, and the packaged chip 14 can be convenient to use.

Figure 41:
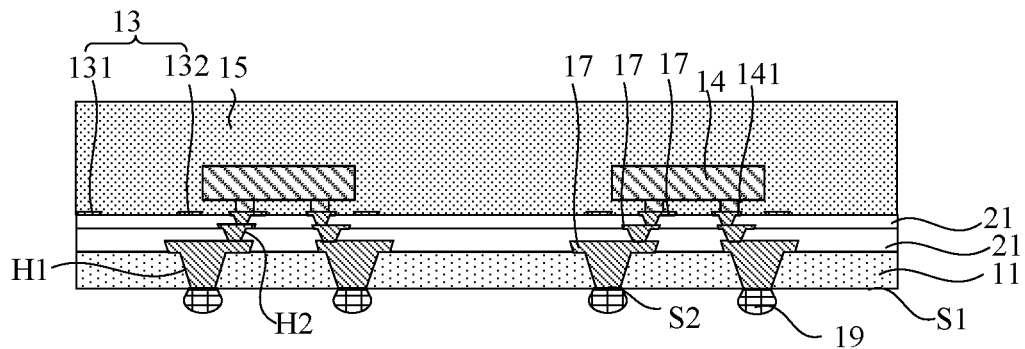
FIG. 41 illustrates another exemplary chip package structure consistent with various disclosed embodiments in the present disclosure.
Figure 42:
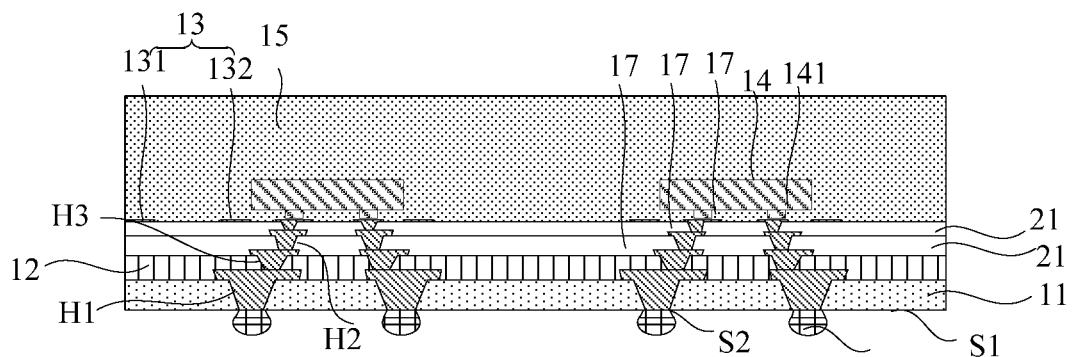
FIG. 42 illustrates another exemplary chip package structure consistent with various disclosed embodiments in the present disclosure.
Figure 43:
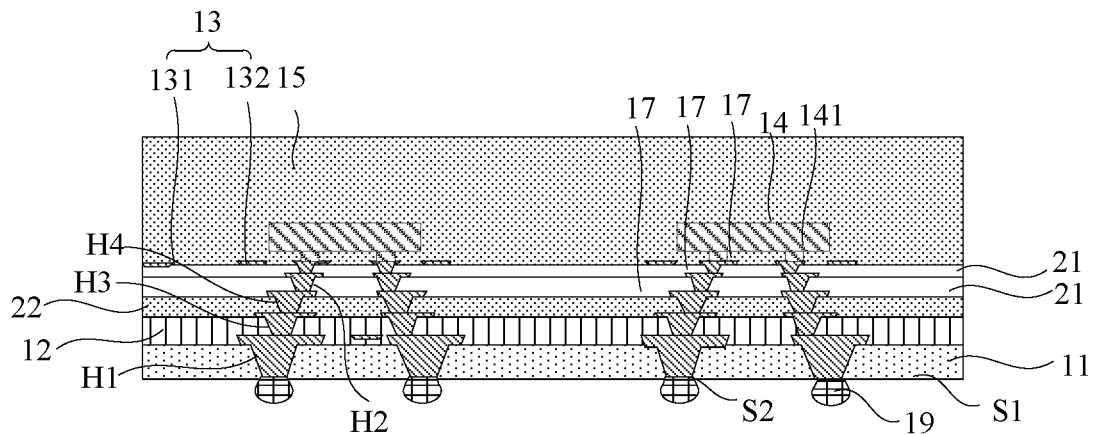
FIG. 43 illustrates another exemplary chip package structure consistent with various disclosed embodiments in the present disclosure.
Figure 44:
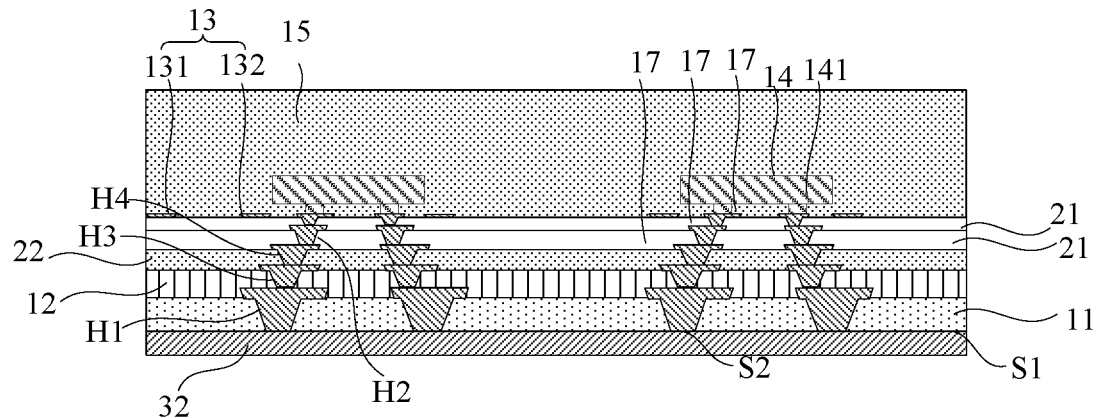
FIG. 44 illustrates another exemplary chip package structure consistent with various disclosed embodiments in the present disclosure.

FIG. 41 illustrates another exemplary chip package structure consistent with various disclosed embodiments in the present disclosure. FIG. 42 illustrates another exemplary chip package structure consistent with various disclosed embodiments in the present disclosure. FIG. 43 illustrates another exemplary chip package structure consistent with various disclosed embodiments in the present disclosure. FIG. 44 illustrates another exemplary chip package structure consistent with various disclosed embodiments in the present disclosure. The metal parts 17 includes at least two layers. A first insulating layer 21 is formed between two adjacent layers of metal parts 17. The first insulating layer 21 includes a plurality of second via holes H2, two adjacent layers of metal parts 17 are electrically connected through second via holes H2.

Specifically, the metal parts 17 may have at least two layers, and the first insulating layer 21 is formed between the two adjacent layers of metal parts 17. The first insulating layer 21 may be patterned to form the second via hole H2. The metal parts 17 are electrically connected through the second via hole H2, the metal pins 141 of the chip 14 is electrically connected to the adjacent metal parts 17, and the multilayer metal parts 17 may serve as the wiring structure of the chip package structure. The number of layers of the metal parts 17 may be two, three, four, five, or more in practical applications, and can be determined according to the size of the chip package structure, and the size and process accuracy of the chip 14. In addition, the dimension of the second via hole H2 close to the chip 14 is different from the dimension of the second via hole H2 far away from the chip 14. Optionally, the dimension of the second via hole H2 close to the chip 14 is larger than the dimension of the second via hole H2 away from the chip 14. An angle between the outer surface of the second via hole H2 and the organic polymer material layer 11 is less than 90°. In present disclosure, multiple layers of metal parts 17 can be formed to adapt to different precision requirement of chip 14. When forming the metal parts 17, panel-level processes may be applied, which is highly flexible and reduces the cost of the chip package structure.

In addition, it should be noted that the second via holes H2 between adjacent insulating layers may not overlap or only partially overlap. The second via holes H2 in the insulating layers and the first via hole H1 of the organic polymer material layer 11 may not overlap or only partially overlap with each other.

As shown in FIGS. 40 to 44, the layer of the metal parts 17 close to the chip 14 includes a first line width, and the layer of the metal parts 17 away from the chip 14 includes a second line width, and the first line width is less than the second line width.

Specifically, the first line width may be the minimum line width of a layer of metal parts 17 close to the chip 14, and the second line width may be the minimum line width of a layer of metal parts 17 far away from the chip 14. The layer of the metal parts 17 close to the chip 14 may be a layer of the metal parts 17 adjacent to the chip 14, and the layer of the metal parts 17 away from the chip 14 may be any other layer away from the chip 14. That is, the metal parts 17 may have a multi-layer structure. For example, the metal parts 17 may include a first metal portion and a second metal portion. The first metal portion has at least two layers, and the second metal portion has at least two layers. The first metal portion includes a first line width, the second metal portion includes a second line width. The first line width is smaller than the second line width.

Specifically, the metal parts 17 closer to the chip 14 may have a high-precision rewiring layer, and the metal parts 17 farther from the chip 14 may have a low-precision rewiring layer. That is, the wiring layer closer to the chip 14 may have higher accuracy, which is beneficial to match the chip 14 with accuracy. For example, the precision of the first metal part is higher and the line width is smaller. The precision of the second metal part is lower and the line width is larger. The first metal part is electrically connected to the metal pins 141 of the chip 14, and matching the chip 14 with accuracy may be facilitated.

It should be noted that the minimum line width of the high-precision metal parts 17 can be, for example, less than 5 μm, 4 μm, 3 μm, 2 μm, 0.5 μm, or less, and the minimum line width of the low-precision metal parts 17 can be, for example, less than 5 μm, 4 μm, 3 μm, 2 μm, 0.5 μm or less.

In present disclosure, the metal parts 17 with different line widths may be used in the chip package structure to facilitate matching the chip 14 with the accuracy of the chip 14.

As shown in FIGS. 42 to 44, the chip package structure further includes: a first protective layer 12, and the first protective layer 12 is located on the side of the organic polymer material layer 11 close to the chip 14. The first protective layer 12 includes a third via hole H3, and the metal parts 17 are at least partially located in the third via hole H3.

Specifically, the chip package structure includes the first protective layer 12 located on the side of the organic polymer material layer 11 close to the chip 14. The first protective layer 12 is deposited on the organic polymer material layer 11. A manufacturing process such as coating is performed to deposit the protective layer 12 on the organic polymer material layer 11, such that the entire package structure is flatter. The first protective layer 12 may be a light-transmissive material. The material of the first protective layer 12 includes silicide, for example, silicon oxide, silicon nitride, or a mixture of silicon oxide and silicon nitride. The thickness of the first protective layer 12 of the silicide material can be relatively thin to reduce the thickness of the chip package structure. The silicide may not only effectively isolate water and oxygen, but also has better light transmittance, such that when cutting and separating multiple chips, damages to the film layer structure of the chips may be avoided, and the yield of the product may be improved.

Specifically, a photolithography process may be performed to form the third via hole H3 in the first protective layer 12. In a direction perpendicular to the organic polymer material layer 11, the first via hole H1 may overlap the third via hole H3. The metal parts 17 are at least partially located in the third via hole H3, and the metal parts 17 may extend along the sidewalls of the third via hole H3. The metal parts 17 in organic polymer material layer 11 is electrically connected to the metal parts 17 in the protective layer 12 and lead out the electrical signal of the chip 14. It should be noted that the first via hole H1 may completely overlap the third via hole H3 to ensure the electrical connection between the metal parts 17.

Specifically, the dimension of the third via hole H3 on the side close to the chip 14 is different from the dimension of the third via hole H3 on the side away from the chip 14. For example, the dimension of the third via hole H3 on the side close to the chip 14 may be larger than that of the third via hole H3. That is, an angle between the outer surface of the formed third via hole H3 and the organic polymer material layer 11 is less than 90°. In addition, it is also possible that the dimension of the third via hole H3 on the side close to the chip 14 may be smaller than the dimension of the third via hole H3 on the side away from the chip 14. The first via hole H3 may be formed this way because, after the chip package structure is formed, photolithography is performed on the side of the organic polymer material layer 11 and the first protective layer away from the chip 14 to form the first via hole H3. In present disclosure, due to the characteristics of the photolithography process, the shape and structure of the first via hole H3 may be formed as described.

In present disclosure, a first protective layer 12 may be further provided, so that the organic polymer material layer 11, the first protective layer 12, and the encapsulating layer 15 together form the sealing structure of the entire chip package, which can effectively isolate and prevent water and oxygen and prevent from entering enter the package structure of the chip 14. As such, the chip 14 may be protected from the influence of the external substances, and the third via hole H3 may be formed in the first protective layer 12 to effectively lead out the electrical signals of the chip 14.

As shown in FIGS. 43 and 44, the chip package structure further includes: a second protective layer 22. The second protective layer 22 is located on the side of the first protective layer 12 away from the organic polymer material layer 11. And the second protective layer 22 includes a fourth via hole H4, and the metal parts 17 may be at least partially located in the fourth via hole H4.

Specifically, the chip package structure may further include the second protective layer 22 located on the side of the first protective layer 12 away from the organic polymer material layer 11. The material of the second protective layer 22 may be plastic. Optionally, the material of the second protective layer 22 may be the same as the material of the encapsulating layer 15. The material of the second protective layer 22 may be epoxy resin molding compound (EMC). Optionally, the organic polymer material layer 11 may be multiplexed as the third protective layer. Since the organic polymer material layer 11 can be made of flexible materials such as polyimide, the organic polymer material layer 11 may help with buffering and protection.

Specifically, a photolithography process may be performed to form the fourth via hole H4 in the second protective layer 22. In a direction perpendicular to the organic polymer material layer 11, the first via hole H4 may overlap the fourth via hole H4. The metal parts 17 are at least partially located in the fourth via hole H4, and the metal parts 17 may extend along the sidewalls of the fourth via hole H4. The metal parts 17 in the first protective layer 12 and the metal parts 17 in the organic polymer material layer 11 are electrically connected, such that the electric signal of the chip 14 is led out. It should be noted that the first via hole H1 may completely overlap the third via hole H3 and the fourth via hole H4 to ensure the electrical connection between the metal parts 17.

Specifically, the dimension of the fourth via hole H4 on the side close to the chip 14 is different from the dimension of the fourth via hole H4 on the side away from the chip 14. For example, the dimension of the fourth via hole H4 on the side close to the chip 14 is larger than the dimension of the fourth via hole H4. That is, the angle between the outer surface of the formed fourth via hole H4 and the organic polymer material layer 11 is less than 90°. In addition, it is also possible that the dimension of the fourth via hole H4 on the side close to the chip 14 is smaller than the dimension of the fourth via hole H4 on the side away from the chip 14. The first via hole H4 may be formed this way because, after the chip package structure is formed, photolithography is performed on the side of the organic polymer material layer 11, the first protective layer, and the second protective layer away from the chip 14 to form the first via hole H4. Due to the characteristics of the photolithography process, the shape and structure of the first via hole H4 may be formed as described.

The chip package structure provided by the embodiment, which includes the second protective layer 22, can effectively prevent external substances such as water and oxygen from entering the inside of the chip package structure. The reliability of the chip package process may be improved, and the service life of the chip 14 may be prolonged. And the fourth via hole H4 may be formed in the second protective layer 22 to effectively lead out the electrical signal of the chip 14.

As shown in FIG. 44, the chip package structure further includes: a third protective layer 32. The third protective layer 32 is located on a side of the organic polymer material layer 11 away from the chip 14.

Specifically, the package structure of the chip 14 includes the third protective layer 32 located on the side of the organic polymer material layer 11 away from the chip 14. The third protective layer 32 may be deposited on a transparent substrate, and then an organic polymer material layer 11 may be deposited on the third protective layer 32. The third protective layer 32 may be a light-transmissive material. The material of the first protective layer 12 includes silicide, for example, silicon oxide, silicon nitride, or a mixture of silicon oxide and silicon nitride. The thickness of the third protective layer 32 of the silicide material may be relatively thin, such that the thickness of the chip package structure is reduced. The silicide can not only effectively isolate water and oxygen, but also has better light permeability, such that when cutting and separating multiple chips, damages to the film layer structure of the chip may be avoided, and the yield of the product may be improved. In addition, when peeling off the transparent substrate, the third protective layer 32 can be provided to avoid damage to the organic polymer material layer 11. The third protective layer 32 can also be peeled off together to further reduce the thickness of the chip package structure.

In present disclosure, as shown in FIGS. 39 to 44, the chip package structure further includes an alignment part 13. The alignment part 13 and the metal parts 17 are located on the same side of the organic polymer material layer 11.

Specifically, the alignment part 13 may be formed on the organic polymer material layer 11, and the alignment part 13 and the metal parts 17 may be located on the same side of the organic polymer material layer 11. The alignment part 13 may include an overall alignment part 131 and a chip alignment part 132. The overall alignment part 131 and the chip alignment part 132 are both located on the same side of the organic polymer material layer 11 as the metal parts 17. The overall alignment part 131 may be an overall alignment mark for the chip package. Each process may align the position according to the overall alignment mark as a standard. Optionally, the material of the overall alignment part 131 may be metal. It is well understood that metal is used as an example in the present embodiment to illustrate as an example. The overall alignment part 131 may also be made of other materials, which is not specifically limited in the present invention. The chip alignment part 132 may be a dedicated alignment mark for the chip 14. When attaching the chip 14, the chip 14 is accurately attached according to the position of the chip alignment part 132, which may improve the accuracy of chip 14 attachment and further improve the efficiency and yield rate of chip package process. Optionally, the material of the alignment part 13 may be metal. It is well understood that the present embodiment only uses metal as an example to illustrate the alignment part 13 exemplarily, and the alignment part 13 may also be made of other materials, which is not specifically limited in the present invention.

It should be noted that when the chip package structure only includes the first protective layer 12, the chip package structure may be located on the first protective layer 12, and the alignment part 13 and the metal parts 17 may be located on the same side of the first protective layer 12. When the chip package structure further includes the second protective layer 22, the chip package structure may be located on the second protective layer 22, and the alignment part 13 and the metal parts 17 may be located on the same side of the second protective layer 22.

In present disclosure, an orthographic projection of the chip 14 on the organic polymer material layer 11 is in contact with an orthographic projection of the alignment part 13 on the organic polymer material layer 11, and the alignment part 13 is located on different sides of the chip 14.

Specifically, as shown in FIGS. 39 to 44, the alignment part 13 is provided on the organic polymer material layer 11. The alignment part 13 is a special alignment mark for the chip 14. Therefore, the alignment part 13 is located on the different sides of the chip 14, and the orthographic projection of the alignment part 13 on the organic polymer material layer 11 is in contact with the orthographic projection of the alignment part 13 on the organic polymer material layer 11. The alignment part 13 may be arranged in a circle around the chip 14 or the alignment part 13 may be arranged on opposite sides of the chip 14. When attaching the chip 14, attaching the chip 14 according to the position of the alignment part 13 may improve the accuracy of the attaching the chip 14 and the efficiency and yield of the chip package process may be further improved. Optionally, the material of the alignment part 13 may be metal. It is well understood that metal is used in the present embodiment as an example to illustrate the material of the alignment part 13. The alignment part 13 may also be made of other materials, which is not specifically limited in the present invention.

In present disclosure, the alignment part 13 is provided to improve the attachment accuracy of the chip 14, so that the metal parts 17 and the metal pins 141 of the chip 14 may be accurately connected, and the yield and efficiency of the chip package process are further improved.

Figure 45:
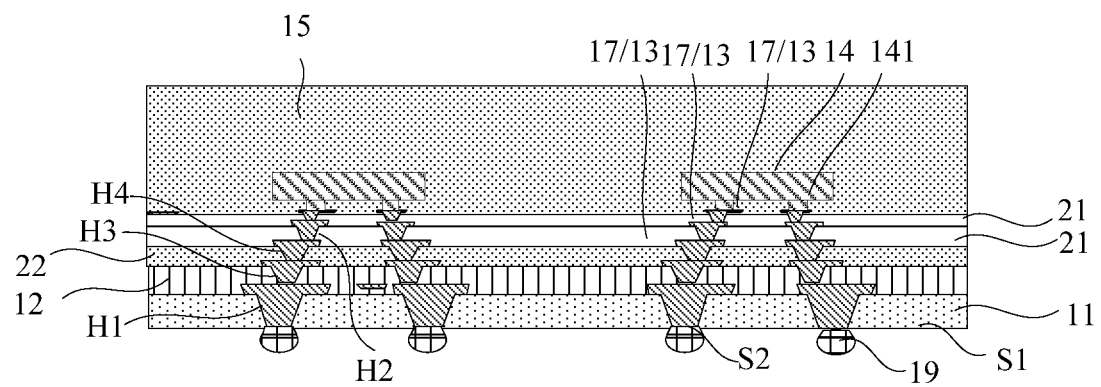
FIG. 45 illustrates another exemplary chip package structure consistent with various disclosed embodiments in the present disclosure.

As shown in FIG. 45 illustrates another exemplary chip package structure consistent with various disclosed embodiments in the present disclosure, and the metal parts 17 are multiplexed as the alignment part 13.

Specifically, a side of the metal parts 17 away from the organic polymer material layer 11 needs to be exposed, so that the metal parts 17 may be electrically connected to the metal pins 141 to lead out the electrical signals of the chip 14. As such, the exposed portion of the metal parts 17 may also be used directly as the alignment part 13.

In present disclosure, the exposed metal parts 17 in the chip package structure are directly used as the alignment part 13, such that the process procedures of the chip package process may be reduced and the efficiency of the chip package process may be improved.

A plastic encapsulation layer is formed to cover the side of the metal parts 17 away from the organic polymer material layer 11, the sidewall of the metal parts 17 and the periphery of the chip 14. In present disclosure, the plastic encapsulation area of the plastic encapsulation layer is increased, which may not only achieve the protection and heat dissipation of the chip 14, but also provide protection for the metal parts 17, thereby the protection performance and heat dissipation performance of the chip package structure is further enhanced.

Figure 46:
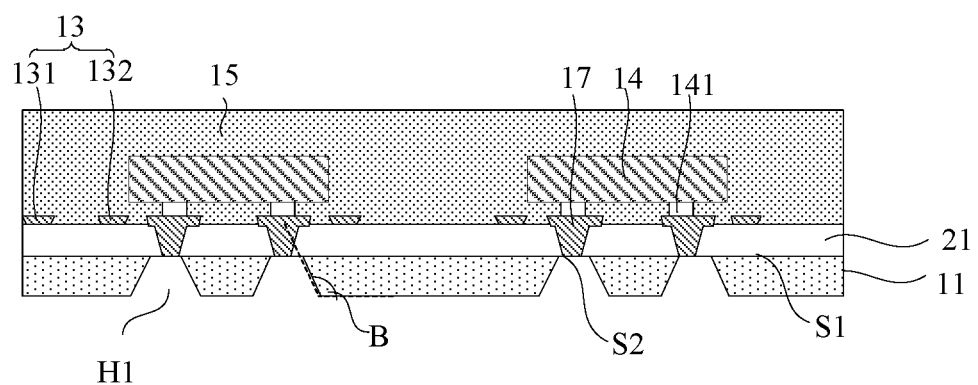
FIG. 46 illustrates another exemplary chip package structure consistent with various disclosed embodiments in the present disclosure.

As shown in FIG. 46 illustrates another exemplary chip package structure consistent with various disclosed embodiments in the present disclosure. The chip package structure includes: a chip 14, including metal pins 141; an organic polymer material layer 11, the organic polymer material layer 11 being located on a side of the metal pins 141 away from the chip 14, the organic polymer material layer 11 including a first via hole H1, and the organic polymer material layer 11 including a first surface S1 close to the chip 14; metal parts 17, metal parts 17 having a least a portion and metal pins 141 being electrically connected, the metal parts 17 including a second surface S2 away from the chip 14, and the second surface S2 and the first surface S1 being flush to each other; an encapsulating layer 15, the encapsulating layer 15 being located on a side of the metal parts 17 away from the organic polymer material layer 11.

As shown in FIG. 46, the organic polymer material layer 11 may be used as another layer of the sealing structure in place of the encapsulating layer 15 when the chip 14 is packaged. Optionally, the organic polymer material layer 11 may be a light-transmitting material. Further, the organic polymer material layer 11 may be polyimide. The material of the encapsulating layer 15 includes epoxy resin molding compound (EMC). Optionally, the encapsulating layer 15 may cover the chip 14 and may protect a side of the chip 14 away from the organic polymer material layer 11 and sidewalls of the chip 14. The encapsulating layer 15 may also provide a heat dissipation path for the chip 14. The chip 14 may be a die made from a wafer using a wafer-level process. The chip 14 may be provided with metal pins 141, and the metal pins 141 are electrically connected to the metal parts 17. In addition, the number of metal pins 141 is two as shown in FIG. 39, and the number of metal pins 141 can also be 3, 4, 5, 7, and so on.

Specifically, the organic polymer material layer 11 may be formed first, and the formed organic polymer material layer 11 is located on the side of the metal pins 141 of the chip 14 away from the chip 14. The metal parts 17 are formed on the organic polymer material layer 11. The metal parts 17 may be formed by electroplating and photo-etching. The metal parts 17 may also be formed be depositing and photo-etching. Further, at least one chip 14 is provided, and the at least one chip 14 includes metal pins 141. When multiple chips 14 are provided, after the chip package structure is formed, cutting can be performed, such that each section of the chip package structure where each chip 14 is located can be used as an independent chip package structure, or multiple chips 14 together form the chip package structure. An encapsulating layer 15 is formed on the chip 14. The encapsulating layer 15 is located on a side of the metal parts 17 away from the organic polymer material layer 11. The encapsulating layer 15 is polished to expose the metal pins 141 of the chip 14, and the metal pins 141 are electrically connected to the metal parts 17. Further, the first via hole H1 may be formed by patterning on the organic polymer material layer 11, and the first via hole H1 may be lithographically formed on the organic polymer material layer 11. The organic polymer material layer 11 includes a first surface S1 close to the chip 14. The metal parts 17 are electrically connected to the metal pins 141, and the metal parts 17 include a second surface S2 away from the chip 14. The first surface S1 and the second surface S2 are flush, that is, the metal parts 17 are not located in the first through hole H1 of the organic polymer material layer 11. It should be noted that the second surface S2 of the metal parts 17 and the first surface S1 of the organic polymer material layer 11 are substantially flush with each other. It means that, due to the influence of the process, the second surface S2 of the metal parts 17 may be slightly higher than the first surface S1 of the organic polymer material layer 11 in a direction perpendicular to the organic polymer material layer 11.

It should be noted that in present disclosure, the chip package structure can be formed on a rigid substrate. The rigid substrate can be a transparent substrate 10. A side of the transparent substrate 10 away from the side of the organic polymer material layer 11 is irradiated with a laser to peel off the transparent substrate 10 and form the chip package structure. In this case, when the organic polymer material layer 11 is formed, it can be formed by coating. In addition, the formed metal parts 17 can be one layer, or the metal parts 17 can be multiple layers, for example, two layers. In this case, the two layers of metal parts 17 may include an insulating layer, and the insulating layer is in contact with the organic polymer. The insulating layer via hole may be formed in the insulating layer. The other layer of metal parts 17 are at least partially located in the insulating layer via hole and extends along the wall of the insulating layer via hole. The two layers of metal parts 17 may be electrically connected through the insulating layer via hole. The insulating layer via hole may be electrically connected to the metal pins 141. The number of layers of the metal parts 17 can also be two, three, four, five, or more, and can be determined according to the size of the chip package structure, and the size and process accuracy of the chip 14.

In addition, it should be noted that the dimension of the first via hole H1 on the side close to the chip 14 is different from the dimension of the first via hole H1 on the side away from the chip 14. For example, the dimension of the first via hole H1 on the side close to the chip 14 is smaller than the dimension of the via hole H1 on the side away from the chip 14. That is, an angle between the outer surface of the first via hole H1 and the organic polymer material layer 11 is greater than 90°. In present disclosure, due to the characteristics of the photolithography process, the shape and structure of the first via hole H1 can be formed as described.

In present disclosure, the encapsulating layer 15 is directly formed on the organic polymer material layer 11 to encapsulate the chip 14, such that re-encapsulation in the chip package structure is not needed, the overall chip package process is reduced, and the efficiency of chip package process is improved. When the chip package structure is made, the metal parts 17 are directly formed on the organic polymer material layer 11 and the organic polymer material layer 11 includes the first via hole H1, such that the metal parts 17 can directly lead the electrical signal of the chip 14 through the first via hole from the metal pins 141 and the manufacturing process is simplified. The organic polymer material layer 11 and the encapsulating layer 15 together constitutes the sealing part of the entire chip package structure, which may effectively isolate external substances, such as water and oxygen, from entering the inside of the chip package structure and protect the chip 14 from the influence of external substances.

Figure 47:
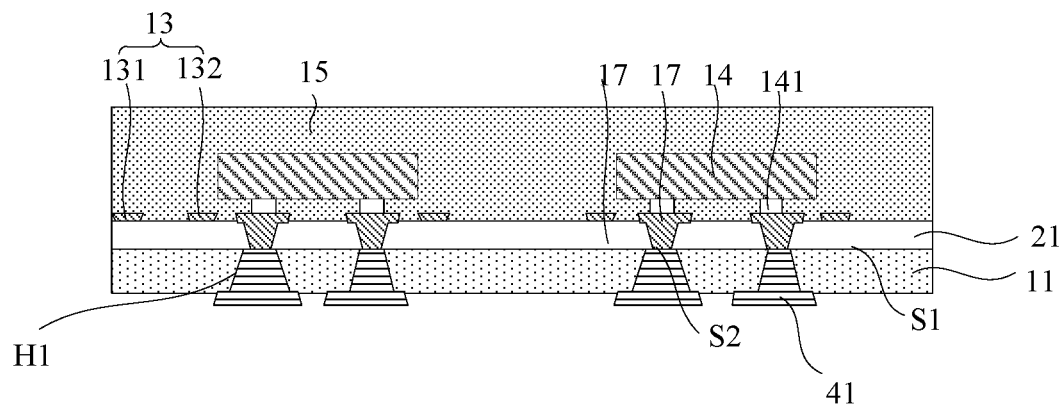
FIG. 47 illustrates another exemplary chip package structure consistent with various disclosed embodiments in the present disclosure.

FIG. 47 illustrates another exemplary chip package structure consistent with various disclosed embodiments in the present disclosure. As shown in FIG. 47, the chip package structure further includes: a connecting structure 41, and at least a portion of the connecting structure 41 goes through the first via hole H1 and the connecting structure 41 is electrically connected to the metal parts 17. Specifically, the chip package structure includes the connecting structure 41, which is at least partially located in the first via hole H1 and extends along the sidewall of the first via hole H1.

Specifically, the organic polymer material layer 11 includes a first surface away from the chip 14 and a second surface close to the chip 14. The connecting structure 41 includes a fifth surface away from the chip 14 and a sixth surface close to the chip 14. The fifth surface protrudes on the first surface of the organic polymer material layer 11, and the sixth surface of the connecting structure 41 is flush with the second surface of the organic polymer material layer 11. The connecting structure 41 is electrically connected to the metal parts 17. In present disclosure, the connecting structure 41 may be provided, such that the electrical signal on the chip 14 may be led out through the metal parts 17 more effectively.

Figure 48:
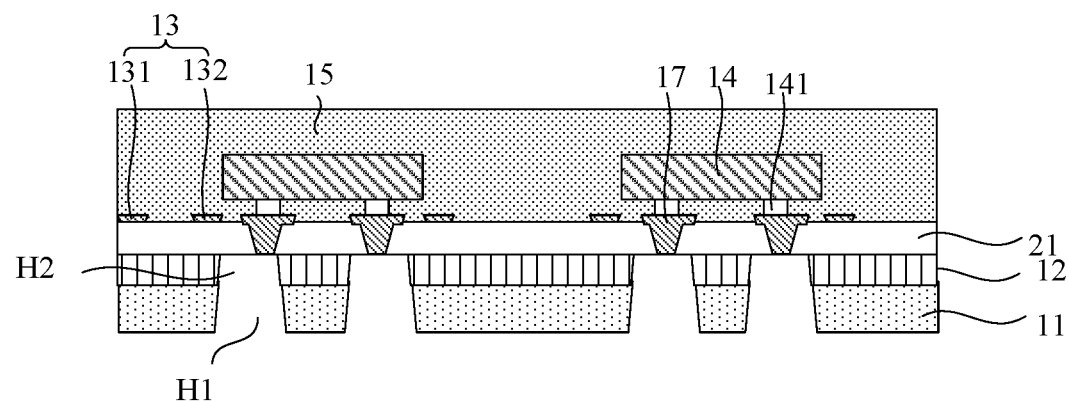
FIG. 48 illustrates another exemplary chip package structure consistent with various disclosed embodiments in the present disclosure.

FIG. 48 illustrates another exemplary chip package structure consistent with various disclosed embodiments in the present disclosure. The chip package structure further includes a protective layer 12, and the protective layer 12 is located on the side of the organic polymer material layer 11 close to the chip 14. The protective layer 12 includes a second via hole, and in a direction perpendicular to the organic polymer material layer 11, the second via hole H2 overlaps the first via hole H1.

Specifically, the chip package structure includes the protective layer 12 on the side of the organic polymer material layer 11 close to the chip 14. The protective layer 12 may be deposited on the organic polymer material layer 11. Due to that organic polymer material layer 11 is usually manufactured by process, such as coating and depositing, depositing the protective layer 12 on the organic polymer material layer 11 can make the entire package structure flatter. The protective layer 12 may be a light-transmissive material. The material of the protective layer 12 includes silicide, for example, silicon oxide, silicon nitride, or a mixture of silicon oxide and silicon nitride. The thickness of the protective layer 12 of the silicide material may be relatively small, such that the thickness of the chip package structure may be reduced. In addition, the silicide can not only effectively isolate water and oxygen, but also can have better light transmittance, such that when cutting and separating multiple chips, damages to the film layer structure of the chips may be avoided, and the yield of the product may be improved.

Specifically, a photolithography process may be performed to form the second via hole H2 on the protective layer 12. In a direction perpendicular to the organic polymer material layer 11, the first via hole H1 may overlap the second via hole H2. The metal parts 17 can lead the electrical signal of the chip 14 through the first via hole H1 and the second via hole H2. It should be noted that the first via hole H1 may completely overlap the second via hole H2.

It should be noted that, in present disclosure, the second surface S2 of the metal parts 17 may be flush with the surface of the protective layer 12 on the side close to the chip 14 or may be partially located in the second via hole H2 of the protective layer 12.

In present disclosure, the protective layer 12 may be provided, so that the organic polymer material layer 11, the protective layer 12, and the encapsulating layer 15 together form the sealing structure of the entire chip package, which can effectively isolate and prevent water and oxygen and prevent from entering enter the package structure of the chip 14. As such, the chip 14 may be protected from the influence of the external substances, and the third via hole H3 may be formed in the first protective layer 12 to effectively lead out the electrical signals of the chip 14.

Figure 49:
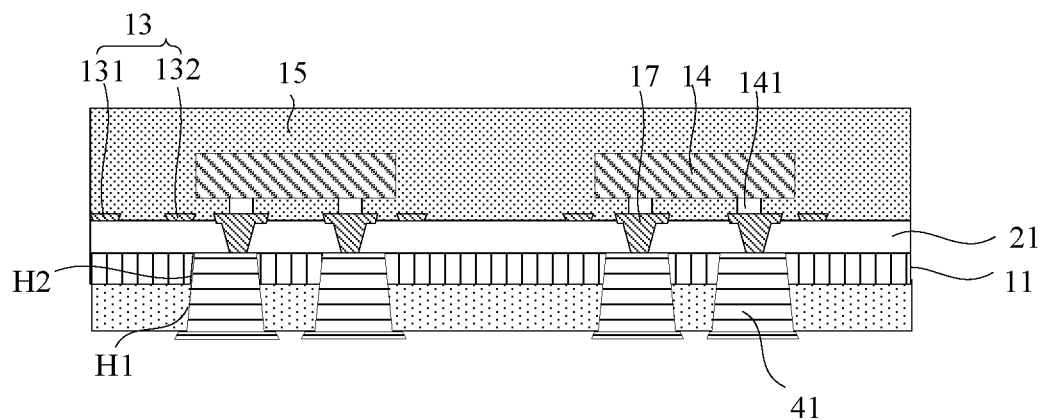
FIG. 49 illustrates another exemplary chip package structure consistent with various disclosed embodiments in the present disclosure.

FIG. 49 illustrates another exemplary chip package structure consistent with various disclosed embodiments in the present disclosure. As shown in FIG. 49, the chip package structure further includes a connecting structure 41. At least a portion of the connecting structure 41 is located the first via hole H1, at least another portion of the connecting structure 41 is located the second via hole H2, and the connecting structure 41 is electrically connected to the metal parts 17.

Specifically, the chip package structure further includes a connecting structure 41. At least a portion of the connecting structure 41 goes through the first via hole H1 and extends along the sidewall of the first via hole H1. At least another portion of the connecting structure 41 goes through the first via hole H2 and extending along the sidewall of the first via hole H2. The connecting structure 41 is electrically connected to the metal parts 17.

Specifically, the organic polymer material layer 11 includes a first surface away from the chip 14 and a second surface close to the chip 14. The protective layer 12 includes a third surface away from the chip 14 and a fourth surface close to the chip 14. The connecting structure 41 includes a fifth surface away from the chip 14 and a sixth surface close to the chip 14. The fifth surface of the connecting structure 41 protrudes on the first surface of the organic polymer material layer 11. The sixth surface of the connecting structure 41 is flush with the fourth surface of the protective layer 12. The connecting structure 41 is electrically connected to the metal parts 17.

In present disclosure, the connecting structure 41 may be provided, so that electrical signals on the chip 14 may be led out through the metal parts 17 more effectively.

As shown in FIG. 49, a dimension of the first via hole H1 close to the chip 14 is smaller than a dimension of the first via hole H1 away from the chip 14. A dimension of the second via hole H2 close to the chip 14 is smaller than the dimension of the first via hole H1 away from the chip 14.

Specifically, the first via hole H1 may be formed in the organic polymer material layer 11, and the dimension of the first via hole H1 on a side close to the chip 14 is different from the dimension of the first via hole H1 on the side away from the chip 14. For example, the dimension of the via hole H1 on the side close to the chip 14 is smaller than the dimension of the first via hole H1 on the side away from the chip 14. That is, an angle between the outer surface of the first via hole H1 and the first surface of the organic polymer material layer 11 is greater than 90°. In present disclosure, due to the characteristics of the photolithography process, the shape and structure of the first via hole H1 may be formed as described.

The dimension of the second via hole on the side close to the chip 14 is different from the dimension on the side of the second via hole H2 away from the chip 14. For example, the dimension of the second via hole on the side close to the chip 14 is smaller than the dimension on the side of the second via hole H2 away from the chip 14. That is, an angle between the outer surface of the first via hole H2 and the organic polymer material layer 11 is greater than 90°. In present disclosure, due to the characteristics of the photolithography process, the shape and structure of the first via hole H1 may be formed as described.

Furthermore, the protective layer 12 may include a first protective layer and a second protective layer. The first protective layer is located on one side of the organic polymer material layer 11, and the second protective layer is located on a side of the first protective layer away from the organic polymer material layer 11. Optionally, the material of the first protective layer may be silicide. The material of the first protective layer may be silicide such as silicon oxide, silicon nitride, and so on. The material of the second protective layer may be plastic. Optionally, the second protective layer 12 may have the same material as the encapsulating layer 15. Optionally, the organic polymer material layer 11 may be multiplexed as a third protective layer. Since the organic polymer material layer 11 is made of flexible materials such as polyimide, the organic polymer material layer 11 can help with buffering and protection.

In present disclosure, the protective layer 12 includes a first protective layer and a second protective layer, which can effectively prevent external substances such as water and oxygen from entering the chip package structure, improve the reliability of the chip package, and extend the service life of the chip 14.

It should be noted that a photolithography process may be performed to form a third via hole on the second protective layer. In a direction perpendicular to the organic polymer material layer 11, the first via hole H1 may overlap the third via hole. The metal parts 17 are at least partially located in the third via hole, and the metal parts 17 may extend along the sidewall of the third via hole. The metal parts in the organic polymer material layer 11 and the metal parts in the first protective layer 12 are electrically connected to lead out the electrical signal of the chip 14. It should be noted that the first via hole H1 may completely overlap the second via and the third via hole to ensure the electrical connection between the metal parts 17.

Specifically, the dimension of the third via hole on the side close to the chip 14 is different from the dimension of the third via hole on the side away from the chip 14. For example, the dimension of the third via hole on the side close to the chip 14 is smaller than that of the third via hole on the side away from the chip 14. That is, an angle between the outer surface of the third via hole and the organic polymer material layer 11 is greater than 90°. The third via hole may be formed this way because, after the chip package structure is formed, photolithography is performed on the side of the organic polymer material layer 11, the first protective layer, and the second protective layer away from the chip 14 to form the third via hole H1. In present disclosure, due to the characteristics of the photolithography process, the shape and structure of the first via hole H1 may be formed as described.

The chip package structure may also include the second protective layer, which can effectively prevent external substances such as water and oxygen from entering the inside of the chip package structure, improve the reliability of the chip package, and prolong the service life of the chip 14. And the third via hole is also formed on the second protective layer to effectively lead out the electrical signal of the chip 14.

Figure 50:
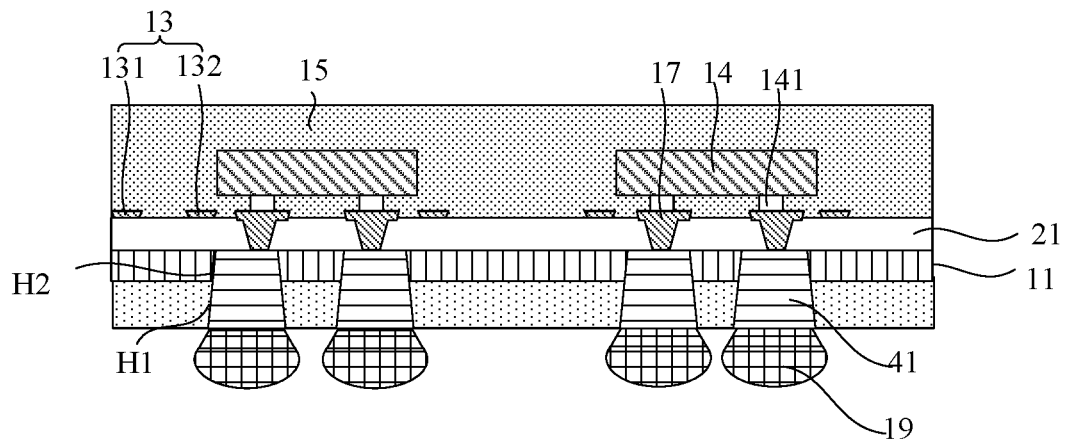
FIG. 50 illustrates another exemplary chip package structure consistent with various disclosed embodiments in the present disclosure.

FIG. 50 illustrates another exemplary chip package structure consistent with various disclosed embodiments in the present disclosure. As shown in FIG. 50, the chip package structure further includes a metal ball 19 located on a side of the connecting structure 41 away from the chip 14. The metal ball 19 and the metal parts 17 may be electrically connected.

Specifically, the metal ball 19 is located on the side of the connecting structure 41 away from the chip 14, so that the electrical connection between the chip 14 and the external circuit is realized. The metal ball 19 may be made of metal such as tin, lead, copper, silver, gold, or an alloy thereof. In present disclosure, a metal ball 19 is formed on the side of the connecting structure 41 away from the organic polymer material layer 11, so that the packaged chip 14 can be soldered to a circuit board or other electronic circuits to facilitate the use of the packaged chip 14.

Figure 51:
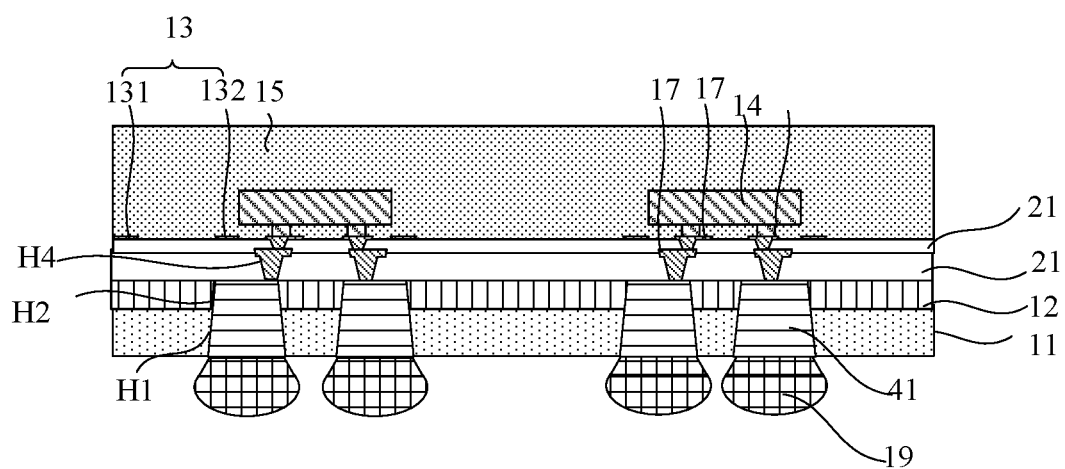
FIG. 51 illustrates another exemplary chip package structure consistent with various disclosed embodiments in the present disclosure.

FIG. 51 illustrates another exemplary chip package structure consistent with various disclosed embodiments in the present disclosure. The metal parts 17 include at least two layers. A first insulating layer 21 is formed between the two adjacent layers of metal parts 17. The first insulating layer 21 includes a plurality of fourth via holes H4, and two adjacent layers of metal parts 17 are electrically connected through the fourth via hole H4. The dimension of the fourth via holes H4 on the side close to the chip 14 is different from the dimension of the fourth via holes H4 on the side away from the chip 14.

Specifically, the metal parts 17 may also have at least two layers, and a first insulating layer 21 is formed between the two adjacent layers of metal parts 17. The first insulating layer 21 may be patterned to form the fourth via holes H4. The metal parts 17 are electrically connected through the fourth via holes H4. The metal pins 141 of the chip 14 may be electrically connected to the adjacent metal parts 17, and the multilayer metal parts 17 may serve as the wiring structure of the chip package structure. The number of layers of the metal parts 17 can also be two, three, four, five, or more, and can be determined according to the size of the chip package structure, and the size and process accuracy of the chip 14. In addition, the dimension of the fourth via holes H4 at an end close to the chip 14 is different from the dimension of the fourth via hole H4 at an end away from the chip 14. For example, the dimension of the fourth via holes H4 at an end close to the chip 14 is greater from the dimension of the fourth via hole H4 at an end away from the chip 14. That is, an angle between the outer surface of the formed fourth via holes H4 and the organic polymer material layer 11 is less than 90°. In present disclosure, multiple layers of metal parts 17 can be formed to adapt to different precision requirement of chip 14. When forming the metal parts 17, panel-level processes may be applied, which is highly flexible and reduces the cost of the chip package structure.

It should be noted that in a direction perpendicular to the organic polymer material layer 11, the plurality of fourth via holes H4 may not overlap or partially overlap, and the fourth via holes H4 are respectively connected to the first via hole H1 and the second via hole H4. The fourth via holes H4 may not overlap or partially overlap the first via holes H1 and the second via holes H2, respectively.

The layer of the metal parts 17 close to the chip 14 includes a first line width, and the layer of the metal parts 17 away from the chip 14 includes a second line width, and the first line width is less than the second line width.

Specifically, the first line width may be the minimum line width of a layer of metal parts 17 close to the chip 14, and the second line width may be the minimum line width of a layer of metal parts 17 away from the chip 14. The layer of the metal parts 17 close to the chip 14 is a layer of the metal parts 17 adjacent to the chip 14, and the layer of the metal parts 17 away from the chip 14 is any other layer or layers of metal parts 17 from the chip 14. Specifically, the metal parts 17 closer to the chip 14 may have a high-precision rewiring layer, and the metal parts 17 farther from the chip 14 may have a low-precision rewiring layer. That is, the wiring layer closer to the chip 14 may have higher accuracy, which is beneficial to match the chip 14 with accuracy. For example, the precision of the first metal part is higher and the line width is smaller. The precision of the second metal part is lower and the line width is larger. The first metal part is electrically connected to the metal pins 141 of the chip 14, and matching the chip 14 with accuracy may be facilitated.

In present disclosure, the metal parts 17 with different line widths may be used in the chip package structure to facilitate matching with the accuracy of the chip 14.

As shown in FIGS. 46 to 51, the chip package structure includes an alignment part 13, and the alignment part 13 and the metal parts 17 are located on the same side of the organic polymer material layer 11.

Specifically, the alignment part 13 may be formed on the organic polymer material layer 11, and the alignment part 13 and the metal parts 17 may be located on the same side of the organic polymer material layer 11. The alignment part 13 may include an overall alignment part 131 and a chip alignment part 132. The overall alignment part 131 and the chip alignment part 132 are both located on the same side of the organic polymer material layer 11 as the metal parts 17. The overall alignment part 131 may be an overall alignment mark for the chip package. Each process may align the position according to the overall alignment mark as a standard. Optionally, the material of the overall alignment part 131 may be metal. It is well understood that metal is used as an example in the present embodiment to illustrate as an example. The overall alignment part 131 may also be made of other materials, which is not specifically limited in the present invention. The chip alignment part 132 may be a dedicated alignment mark for the chip 14. When attaching the chip 14, the chip 14 is accurately attached according to the position of the chip alignment part 132, which may improve the accuracy of chip 14 attachment and further improve the efficiency and yield rate of chip package process. Optionally, the material of the alignment part 13 may be metal. It is well understood that the present embodiment only uses metal as an example to illustrate the alignment part 13 exemplarily, and the alignment part 13 may also be made of other materials, which is not specifically limited in the present invention.

It should be noted that when the chip package structure only includes the protective layer 12, the chip package structure may be located on the protective layer 12, and the alignment part 13 and the metal parts 17 may be located on the same side of the protective layer 12. When the chip package structure further includes additional protective layers, the chip package structure may be located on the additional protective layer, and the alignment part 13 and the metal parts 17 may be located on the same side of the additional protective layer.

As shown in FIGS. 46-51, an orthographic projection of the chip 14 on the organic polymer material layer 11 is in contact with an orthographic projection of the alignment part 13 on the organic polymer material layer 11, and the alignment part 13 is located on different sides of the chip 14.

Specifically, the alignment part 13 is provided on the organic polymer material layer 11. The alignment part 13 is a special alignment mark for the chip 14. Therefore, the alignment part 13 is located on the different sides of the chip 14, and the orthographic projection of the alignment part 13 on the organic polymer material layer 11 is in contact with the orthographic projection of the alignment part 13 on the organic polymer material layer 11. The alignment part 13 may be arranged in a circle around the chip 14 or the alignment part 13 may be arranged on opposite sides of the chip 14. When attaching the chip 14, attaching the chip 14 according to the position of the alignment part 13 may improve the accuracy of the attaching the chip 14 and the efficiency and yield of the chip package process may be further improved. Optionally, the material of the alignment part 13 may be metal. It is well understood that metal is used in the present embodiment as an example to illustrate the material of the alignment part 13. The alignment part 13 may also be made of other materials, which is not specifically limited in the present invention.

Based on the above embodiments, the metal parts 17 is multiplexed as the alignment part 13.

Specifically, a side of the metal parts 17 away from the organic polymer material layer 11 needs to be exposed, so that the metal parts 17 may be electrically connected to the metal pins 141 to lead out the electrical signals of the chip 14. As such, the exposed portion of the metal parts 17 may also be used directly as the alignment. portion 13.

In present disclosure, the exposed metal parts 17 in the chip package structure are directly used as the alignment part 13, such that the process procedures of the chip package process may be reduced and the efficiency of the chip package process may be improved.

A plastic encapsulation layer is formed to cover the side of the metal parts 17 away from the organic polymer material layer 11, the sidewall of the metal parts 17 and the periphery of the chip 14. In present disclosure, the plastic encapsulation area of the plastic encapsulation layer is increased, which may not only achieve the protection and heat dissipation of the chip 14, but also provide protection for the metal parts 17, thereby the protection performance and heat dissipation performance of the chip package structure is further enhanced.

Figure 52:
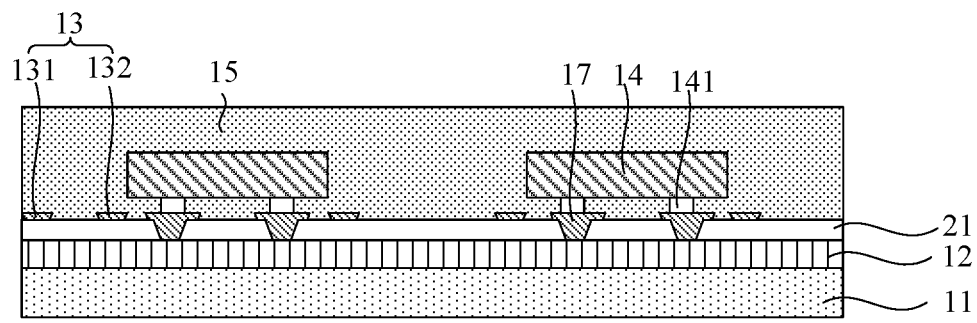
FIG. 52 illustrates another exemplary chip package structure consistent with various disclosed embodiments in the present disclosure.

FIG. 52 illustrates another exemplary chip package structure consistent with various disclosed embodiments in the present disclosure. The chip package structure includes: an organic polymer material layer 11; a protective layer 12 covering the organic polymer material layer 11 and in contact with the organic polymer material layer 11; metal parts 17, located on a side of the protective layer 12 away from the organic polymer material layer 11; a chip 14, located on a side of the metal parts 17 away from the organic polymer material layer 11, including metal pins 141, the metal pins 141 being located on the side of the chip 14 close to the organic polymer material layer 11 and electrically connected to the metal parts 17; an encapsulating layer 15, located on a side of the metal parts 17 away from the organic polymer material 11.

Specifically, as shown in FIG. 52, the organic polymer material layer 11 may be used as another layer of the sealing structure in place of the encapsulating layer 15 when the chip 14 is packaged. Optionally, the organic polymer material layer 11 and the protective layer 12 may all be a light-transmitting material. Further, the organic polymer material layer 11 may be polyimide. The material of the encapsulating layer 15 includes epoxy resin molding compound (EMC). Optionally, the encapsulating layer 15 may cover the chip 14 and may protect a side of the chip 14 away from the organic polymer material layer 11 and sidewalls of the chip 14. The encapsulating layer 15 may also provide a heat dissipation path for the chip 14. The chip 14 may be a die made from a wafer using a wafer-level process. The chip 14 may be provided with metal pins 141, and the metal pins 141 are electrically connected to the metal parts 17. In addition, the number of metal pins 141 is two as shown in FIG. 52, and the number of metal pins 141 can also be 3, 4, 5, 7, and so on.

Specifically, the organic polymer material layer 11 may be formed first, and the formed organic polymer material layer 11 is located on the side of the metal pins 141 away from the chip 14. Due to that organic polymer material layer 11 is usually manufactured by process, such as coating and depositing, depositing the protective layer 12 on the organic polymer material layer 11 can make the entire package structure flatter. The metal parts 17 are formed on the organic polymer material layer 11. The metal parts 17 may be formed by electroplating and photo-etching. The metal parts 17 may also be formed be depositing and photo-etching. Further, at least one chip 14 is provided, and the at least one chip 14 includes metal pins 141. When multiple chips are provided, after the chip package structure is formed, cutting can be performed, such that each section of the chip package structure where each chip 14 is located can be used as an independent chip package structure, or multiple chips together form the chip package structure. An encapsulating layer 15 is formed on the chip 14. The encapsulating layer 15 is located on a side of the metal parts 17 away from the organic polymer material layer 11. The encapsulating layer 15 is polished to expose the metal pins 141 of the chip 14, and the metal pins 141 are electrically connected to the metal parts 17.

It should be noted that in present disclosure, the chip package structure can be formed on a rigid substrate. The rigid substrate can be a transparent substrate 10. A side of the transparent substrate 10 away from the side of the organic polymer material layer 11 is irradiated with a laser to peel off the transparent substrate 10 and form the chip package structure. The organic polymer material layer 11 may be formed by coating. In addition, the formed metal parts 17 can be one layer, or the metal parts 17 can be multiple layers, for example, two layers, three layers, four layers, five layers or more. In actual applications, the number of layers can be determined based on the size of the package structure of the chip, the size of the chip, and process accuracy.

In present disclosure, the encapsulating layer 15 is directly formed on the organic polymer material layer 11 to encapsulate the chip 14, and there is no need to re-package the chip 14 in the chip package structure, such that the procedures of the entire chip package process is reduced and the efficiency of chip package is improved. The organic polymer material layer 11 and the encapsulating layer 15 together constitutes the sealing part of the entire chip package structure, which may effectively isolate external substances, such as water and oxygen, from entering the inside of the chip package structure and protect the chip 14 from the influence of external substances.

In present disclosure, the protective layer 12 may include a first protective layer and a second protective layer. The first protective layer is located on one side of the organic polymer material layer 11, and the second protective layer is located on a side of the first protective layer away from the organic polymer material layer 11. Optionally, the material of the first protective layer may be silicide. The material of the first protective layer may be silicide such as silicon oxide, silicon nitride, and so on. The material of the second protective layer may be plastic.

Specifically, the protective layer includes the first protective layer and the second protective layer. The material of the first protective layer may be silicide such as silicon oxide and silicon nitride, and the material of the second protective layer may be plastic. Optionally, the material of the second protective layer may be the same as the material of the encapsulating layer 15. Optionally, the organic polymer material layer 11 may be multiplexed as a third protective layer. Since the organic polymer material layer 11 is made of flexible materials such as polyimide, the organic polymer material layer 11 can help with buffering and protection.

It should be noted that when the signal on the chip 14 needs to be led out from the metal parts 17, a via hole may be formed in the organic polymer material layer 11 and the protective layer, and the metal ball 19 may be formed on the side of the organic polymer material layer 11 away from the protective layer 12, so that the packaged chip 14 can be soldered to a circuit board or other electronic circuits to facilitate the use of the packaged chip 14. In addition, the shape and structure of the via hole in the organic polymer material layer and the protective layer was described in the above-mentioned embodiments, and will not be repeated here.

In present disclosure, the protective layer includes the first protective layer and the second protective layer, which can effectively prevent external substances such as water and oxygen from entering the chip package structure, improve the reliability of the chip package, and extend the service life of chip 14.

As shown in FIG. 52, the chip package structure further includes: an alignment part 13, and the alignment part 13 and the metal parts 17 are located on a same side of the organic polymer material layer 11. Along a perpendicular direction to the organic polymer material layer 11, the orthographic projection of the chip 14 on the organic polymer material layer 11 abuts an orthographic projection of the alignment part 13 on the organic polymer material layer 11, and the alignment part is located at different sides of the chip 14.

Specifically, the alignment part 13 may be formed on the organic polymer material layer 11, and the alignment part 13 and the metal parts 17 may be located on the same side of the organic polymer material layer 11. For example, the alignment part 13 may be configured to surround the chip 14 as a circle. Alternatively, the alignment part 13 may be configured to be on opposite sides of the chip 14. When attaching the chip 14, attaching the chip 14 according to the position of the alignment part 13 can improve the accuracy of attaching the chip 14 to improve the efficiency and yield of the chip package process. The alignment part 13 may include an overall alignment part 131 and a chip alignment part 132. The overall alignment part 131 and the chip alignment part 132 are both located on the same side of the organic polymer material layer 11 as the metal parts 17. The overall alignment part 131 may be an overall alignment mark for the chip package. Each process may align the position according to the overall alignment mark as a standard. Optionally, the material of the overall alignment part 131 may be metal. It is well understood that metal is used as an example in the present embodiment to illustrate as an example. The overall alignment part 131 may also be made of other materials, which is not specifically limited in the present invention. The alignment part 13 may also be made of other materials, which is not specifically limited in the present invention.

Optionally, the material of the alignment part 13 may be metal. It is well understood that the present embodiment only uses metal as an example to illustrate the material of the alignment part 13 exemplarily, and the alignment part 13 may also be made of other materials, which is not specifically limited in the present invention.

In present disclosure, the alignment part 13 is formed on the side of the transparent substrate away from the protective layer 12 to improve the accuracy of the chip attachment, connect the metal parts 17 and the metal pins 141 of the chip 14 accurately, and improve the yield and efficiency of the chip package process.

Based on the above embodiments, the metal parts 17 are multiplexed as the alignment part 13.

Figure 53:
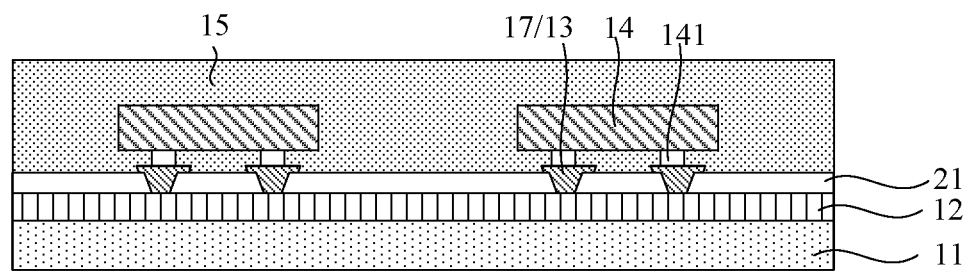
FIG. 53 illustrates another exemplary chip package structure consistent with various disclosed embodiments in the present disclosure.

FIG. 53 illustrates another exemplary chip package structure consistent with various disclosed embodiments in the present disclosure. The side of the metal parts 17 away from the organic polymer material layer 11 needs to be exposed, so that the metal parts 17 may be electrically connected to the metal pins 141 to lead out the electrical signals of the chip 14. As such, the exposed portion of the metal parts 17 may also be used directly as the alignment portion 13.

In present disclosure, the exposed metal parts 17 in the chip package structure are directly used as the alignment part 13, such that the process procedures of the chip package process may be reduced and the efficiency of the chip package process may be improved.

Figure 54:
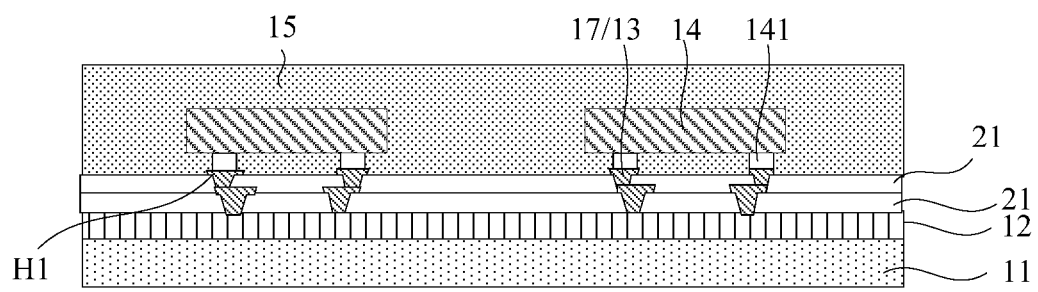
FIG. 54 illustrates another exemplary chip package structure consistent with various disclosed embodiments in the present disclosure.

FIG. 54 illustrates another exemplary chip package structure consistent with various disclosed embodiments in the present disclosure. The metal parts 17 includes at least two layers. A first insulating layer 21 is formed between two adjacent layers of metal parts 17. The first insulating layer 21 includes a plurality of first via holes H1, two adjacent layers of metal parts 17 are electrically connected through first via holes H1. In a direction perpendicular to the organic polymer material layer 11, the adjacent first via holes H1 do not overlap or at least partially overlap.

Specifically, the metal parts 17 includes at least two layers. A first insulating layer 21 is formed between two adjacent layers of metal parts 17. The first insulating layer 21 includes a plurality of second via holes H1, two adjacent layers of metal parts 17 are electrically connected through second via holes H1. In a direction perpendicular to the organic polymer material layer 11, the adjacent first via holes H1 do not overlap or at least partially overlap. A dimension of the first via hole H1 at an end close to the chip 14 is different than a dimension of the first via hole H1 at an end away from the chip 14. It should be noted that FIG. 54 only illustrates that adjacent via holes H1 at least partially overlap. Alternatively, the adjacent via hole H1 may not overlap, as long as the two adjacent layers of metal parts 17 are electrically connected.

Specifically, the metal parts 17 includes at least two layers. A first insulating layer 21 is formed between two adjacent layers of metal parts 17. The first insulating layer 21 includes a plurality of second via holes H1, two adjacent layers of metal parts 17 are electrically connected through second via holes H1. The metal pins 141 of the chip 14 are electrically connected to the adjacent metal parts 17. The multi-layered metal parts 17 may be the rewiring structure for the chip package structure. In a direction perpendicular to the organic polymer material layer 11, the adjacent first via holes H1 do not overlap or at least partially overlap, as long as it is ensured that the multi-layered metal parts 17 are electrically connected. In addition, the dimension of the first via hole H1 near the chip 14 is different from the dimension of the first via hole H1 far away from the chip 14. Optionally, the dimension of the first via hole H1 near the chip 14 is larger than the dimension of the first via hole H1 away from the chip 14. That is, an angle between the outer surface of the formed first via hole H1 and the organic polymer material layer 11 is less than 90°. In present disclosure, multiple layers of metal parts 17 may be formed to adapt to different precision requirement of chip 14. When forming the metal parts 17, panel-level processes may be applied, which is highly flexible and reduces the cost of the chip package structure.

In present disclosure, the layer of the metal parts 17 close to the chip 14 includes a first line width, and the layer of the metal parts 17 away from the chip 14 includes a second line width, and the first line width is less than the second line width.

Specifically, the first line width may be the minimum line width of a layer of metal parts 17 close to the chip 14, and the second line width may be the minimum line width of a layer of metal parts 17 far away from the chip 14. The layer of the metal parts 17 close to the chip 14 may be a layer of the metal parts 17 adjacent to the chip 14, and the layer of the metal parts 17 away from the chip 14 may be any other layer away from the chip 14. Specifically, the metal parts 17 closer to the chip 14 may have a high-precision rewiring layer, and the metal parts 17 farther from the chip 14 may have a low-precision rewiring layer. That is, the wiring layer closer to the chip 14 may have higher accuracy, which is beneficial to match the chip 14 with accuracy. It should be noted that the minimum line width of the high-precision metal parts 17 can be, for example, less than 5 μm, 4 μm, 3 μm, 2 μm, 0.5 μm or less, and the minimum line width of the low-precision metal parts 17 can be, for example, less than 5 μm, 4 μm, 3 μm, 2 μm, 0.5 μm or less.

In present disclosure, the metal parts 17 with different line widths may be used in the chip package structure to facilitate matching the chip 14 with the accuracy of the chip 14.

In present disclosure, a plastic encapsulation layer is formed to cover the side of the metal parts 17 away from the organic polymer material layer 11, the sidewall of the metal parts 17 and the periphery of the chip 14. In present disclosure, the plastic encapsulation area of the plastic encapsulation layer is increased, which may not only achieve the protection and heat dissipation of the chip 14, but also provide protection for the metal parts 17, thereby the protection performance and heat dissipation performance of the chip package structure is further enhanced.

In the present disclosure, the encapsulating layer may be formed directly on the organic polymer material layer and the protective layer to package the plurality of chips. After lifting off the transparent substrate, a second packaging process at a side of the plurality of chips close to the transparent substrate with EMC may be avoided. The process for the chip package may be simplified and a chip package efficiency may be improved. The plurality of alignment parts may improve the alignment accuracy and the accuracy of the connection between the metal pins of the plurality of chips and the plurality of metal parts. The reliability of the entire chip package and a good yield ratio of the chip package may be improved correspondingly. Subsequent film layers may be formed and/or stacked on the transparent substrate, and the organic polymer material layer and the protective layer may be made of materials with a certain transparent rate. Damage on the plurality of chips in the subsequent cutting process may be avoided. The reliability of the entire chip package and the good yield ratio of the chip package may be improved further. The organic polymer material layer, the protective layer, and the encapsulating layer may together form an encapsulating structure for the chip package, to effectively prevent external matters (such as water and oxygen) from entering an inside of the chip package structure, and avoid influence of the external matters (such as water and oxygen) on performance of the plurality of chips. The organic polymer material layer may be used as a flexible substrate and may be formed by current technical process. The flatness of the entire chip package structure may be improved and the transparent substrate may be lifted off easily by the laser. The efficiency of the entire chip package and the good yield ratio of the chip package may be improved further.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments but may be embodied in other equivalent forms without departing from the scope of the present disclosure, which is determined by the appended claims.

What is claimed is:

1. A chip package structure, comprising:
   a chip, the chip including metal pins;
   an organic polymer material layer, the organic polymer material layer being located on a side of the metal pins away from the chip, the organic polymer material layer including a first via hole, and the organic polymer material layer including a first surface away from the chip;
   metal parts, at least a first portion of the metal parts being located in the first via hole, the metal parts and metal pins being electrically connected, the metal parts including a second surface away from the chip, and the second surface and the first surface being flush to each other;
   an encapsulating layer, the encapsulating layer being located on a side of the metal parts away from the organic polymer material layer; and
   an alignment part, wherein an orthographic projection of the chip on the organic polymer material layer borders on an orthographic projection of the alignment part on the organic polymer material layer.

2. The chip package structure according to claim 1, wherein a dimension of the first via hole on a first side close to the chip is larger than a dimension of the first via hole on a second side away from the chip.

3. The chip package structure according to claim 1, further comprising: a metal ball located on a side of the metal parts away from the chip and electrically connected to the metal parts.

4. The chip package structure according to claim 1, wherein the metal parts include at least two layers, and the chip package structure further includes:
   a first insulating layer, formed between two adjacent layers of metal parts, wherein the first insulating layer includes a plurality of second via holes, the two adjacent layers of metal parts are electrically connected through the second via holes, and a dimension of the second via holes on a first side close to the chip is larger than a dimension of the second via holes on a second side away from the chip.

5. The chip package structure according to claim 4, wherein a first layer of the at least two layers of the metal parts close to the chip has a first line width, and a second layer of the at least two layers of the metal parts away from the chip has a second line width, and the first line width is smaller than the second line width.

6. The chip package structure of claim 1, further including:
   a first protective layer, wherein the first protective layer is located on a side of the organic polymer material layer close to the chip, the first protective layer includes a third via hole, and at least a second portion of the metal parts being located in the third via hole.

7. The chip package structure of claim 6, further including:
   a second protective layer, wherein the second protective layer is located on a side of the first protective layer away from the organic polymer material layer, and the second protective layer includes a fourth via hole, and at least a third portion of the metal parts being located in the fourth via hole.

8. The chip package structure of claim 1, further including:
   a third protective layer, wherein the third protective layer is located on a side of the organic polymer material layer away from the chip.

9. The chip package structure of claim 1, wherein the alignment part and the metal parts are located on a same side of the organic polymer material layer.

10. The chip package structure of claim 9, wherein the alignment part includes at least two alignment parts located on different sides of the chip.

11. The chip package structure of claim 9, wherein the metal parts are multiplexed as the alignment part.

12. The chip package structure of claim 1, wherein the encapsulating layer covers the side of the metal parts away from the organic polymer material layer, sidewalls of the metal parts, and a periphery of the chip.

* * * * *